United States Patent
Nguyen et al.

(10) Patent No.: US 12,313,684 B2
(45) Date of Patent: May 27, 2025

(54) HIGH-VOLTAGE SYSTEM TEST MEASUREMENT SYSTEMS AND METHODS

(71) Applicants: Binh Thanh Nguyen, Union City, CA (US); Joshua David Freeman, Livermore, CA (US); Matt David Ruth, Castro Valley, CA (US); Stephan Wayne Finley, Castro Valley, CA (US)

(72) Inventors: Binh Thanh Nguyen, Union City, CA (US); Joshua David Freeman, Livermore, CA (US); Matt David Ruth, Castro Valley, CA (US); Stephan Wayne Finley, Castro Valley, CA (US)

(73) Assignee: Gillig LLC, Livermore, CA (US)

( * ) Notice: Subject to any disclaimer, the term of this patent is extended or adjusted under 35 U.S.C. 154(b) by 0 days.

(21) Appl. No.: 16/909,432

(22) Filed: Jun. 23, 2020

(65) Prior Publication Data

US 2021/0003635 A1    Jan. 7, 2021

Related U.S. Application Data

(60) Provisional application No. 62/870,010, filed on Jul. 2, 2019, provisional application No. 62/869,447, filed on Jul. 1, 2019.

(51) Int. Cl.
   *G01R 31/327*  (2006.01)
   *B60L 58/10*   (2019.01)
   *G01R 31/52*   (2020.01)

(52) U.S. Cl.
   CPC ......... *G01R 31/3275* (2013.01); *G01R 31/52* (2020.01); *B60L 58/10* (2019.02); *B60L 2200/18* (2013.01)

(58) Field of Classification Search
   None
   See application file for complete search history.

(56) References Cited

U.S. PATENT DOCUMENTS

| | | | |
|---|---|---|---|
| 5,266,902 A * | 11/1993 | Kovacich | G01R 31/50 324/133 |
| 5,696,658 A | 12/1997 | Pietrobon | |
| 6,008,972 A | 12/1999 | Pietrobon | |
| 6,833,708 B2 | 12/2004 | Furukawa | |
| 6,932,174 B2 | 8/2005 | Hirata et al. | |
| 6,937,026 B2 | 8/2005 | Lindley et al. | |

(Continued)

OTHER PUBLICATIONS

Office Action dated Sep. 9, 2021, for U.S. Appl. No. 16/909,451.

(Continued)

*Primary Examiner* — Nasima Monsur
(74) *Attorney, Agent, or Firm* — Nelson Mullins Riley & Scarborough LLP

(57) ABSTRACT

In a method and apparatus, an electrical load is disposed across an electric power source. First and second electrical components are disposed between first and second terminals, respectively, and the load and power source. The first electrical component is configured so that the first component passes at most a low level electric current to the first terminal upon a short circuit condition. The second electrical component is configured so that the second component passes at most a low level electric current to the second terminal upon a short circuit condition.

14 Claims, 14 Drawing Sheets

(56) References Cited

U.S. PATENT DOCUMENTS

| | | | |
|---|---|---|---|
| 7,187,091 B2 | 3/2007 | Veil et al. | |
| 7,755,869 B2 | 7/2010 | Mikrut | |
| 8,552,878 B2 | 10/2013 | Jordan | |
| 9,128,119 B2 | 9/2015 | Said | |
| 9,162,639 B2 | 10/2015 | Kanzaki et al. | |
| 9,239,371 B1 | 1/2016 | Bradley | |
| 9,397,496 B2 | 7/2016 | Kang et al. | |
| 9,401,595 B2 | 7/2016 | Ge et al. | |
| 9,429,597 B1* | 8/2016 | Bierer | G01R 19/2503 |
| 9,461,459 B2 | 10/2016 | Henneberger | |
| 9,537,311 B2* | 1/2017 | Tenca | H02J 1/08 |
| 2003/0118876 A1 | 6/2003 | Sugiura et al. | |
| 2005/0231217 A1* | 10/2005 | Carruthers | G01R 31/52 |
| | | | 324/691 |
| 2010/0019570 A1 | 1/2010 | Kade et al. | |
| 2010/0114394 A1 | 5/2010 | Kobayashi et al. | |
| 2010/0245109 A1* | 9/2010 | Ashoff | F21S 2/005 |
| | | | 362/249.02 |
| 2013/0069677 A1* | 3/2013 | Mogaveera | G01R 15/14 |
| | | | 324/713 |
| 2013/0241583 A1 | 9/2013 | Chen | |
| 2014/0070831 A1 | 3/2014 | Kushnick et al. | |
| 2016/0091551 A1* | 3/2016 | Sun | G01R 31/52 |
| | | | 701/34.2 |
| 2017/0334295 A1 | 11/2017 | Turner et al. | |
| 2018/0208079 A1* | 7/2018 | Noppakunkajorn | B60L 3/003 |
| 2019/0296541 A1* | 9/2019 | Mensch | B60L 3/04 |
| 2021/0005410 A1 | 1/2021 | Nguyen et al. | |

OTHER PUBLICATIONS

Response to Office Action dated Sep. 9, 2021, for U.S. Appl. No. 16/909,451.
Final Office Action dated May 10, 2022, for U.S. Appl. No. 16/909,451.
Response to Final Office Action dated May 10, 2022, for U.S. Appl. No. 16/909,451.
Office Action dated Mar. 6, 2023, for U.S. Appl. No. 16/909,451.
Response to Office Action dated Mar. 6, 2023, for U.S. Appl. No. 16/909,451.
Final Office Action dated Oct. 31, 2023, for U.S. Appl. No. 16/909,451.
Non-Final Office Action dated Jun. 21, 2024, for U.S. Appl. No. 16/909,451.
Final Office Action dated Dec. 12, 2024, for U.S. Appl. No. 16/909,451.

* cited by examiner

HIGH-VOLTAGE SYSTEM TEST MEASUREMENT SYSTEMS AND METHODS

CROSS REFERENCE TO RELATED APPLICATION

The present application claims the benefit of U.S. provisional patent application No. 62/869,447, filed Jul. 1, 2019, and U.S. provisional patent application No. 62/870,010, filed Jul. 2, 2019, entitled HIGH-VOLTAGE TEST MEASUREMENT SYSTEMS AND METHODS, the entire disclosures of each which are hereby incorporated by reference herein.

TECHNICAL FIELD

Embodiments of the present disclosure generally relate to the field of high-voltage electrical systems. More particularly, certain embodiments of the present disclosure relate to improved high-voltage electrical systems wherein a test port is provided so that an operator can ensure that an electrically safe working condition exists prior to performing maintenance on the high-voltage electrical system. Certain embodiments of the present disclosure may find use in electrically-powered vehicles, among other applications.

BACKGROUND

High-voltage electrical systems are found in a variety of applications, including in electrically-powered vehicles. In general, a high-voltage electrical system may include a power source, such as mains power or one or more batteries, that serve an electrical load. As an example, a battery powered electric bus might have a plurality of high-voltage battery packs that serve a variety of high-voltage components or systems on the bus, such as an electric drive train, a heating, ventilation, and air conditioning (HVAC) system, an air compressor, a coolant heater, and DC/AC inverters. These high-voltage components may operate at voltages up to seven hundred and fifty volts direct current (750 VDC). Other high-voltage electrical systems have other components that operate at similarly high, or higher, voltages.

As those of skill in the art will appreciate, the electric current that flows in a high-voltage electrical system may also be high, and human operators must exercise caution when performing maintenance on the high-voltage electrical system components and/or the electric power source. Even if the overall system is shut down or otherwise non-operational, however, dangerously high voltages can still be present in the high-voltage electrical system because the electric power source is not necessarily disconnected from all or part of the electrical circuitry. Also, dangerously high voltages can still be present because of secondary sources of residual energy, such as flywheels, capacitors, inductors, and motor back EMF, among others.

Accordingly, a typical high-voltage electrical system includes one or more safety systems, such as switches (including electrical and manual disconnects, electrical contactors, and interlocks) at various points in the electrical circuitry. Prior to working on the high-voltage electrical system, an operator may perform a "lockout/tagout" (LOTO) procedure, including toggling one or more manual switches and locking them in the disconnected position, to prevent unexpected energization of the system while maintenance is being performed. While this procedure is intended to create an electrically safe working condition, after following it the operator must nonetheless verify that the high-voltage electrical system is electrically safe prior to beginning work. The operator may use a test instrument (e.g., a multimeter) to take measurements of electrical characteristics at various points in the high-voltage electrical system to ensure hazardous voltages and currents are not still present in the system. Due to the risk of high current present in the system, the operator may be required to wear various safety gear, including a full body arc-flash suit. The suit is to protect the operator from electrocution caused by electric arcs between the electrical system and the operator.

The foregoing discussion is intended only to illustrate various aspects of the related art in the field of the disclosure at the time, and should not be taken as a disavowal of claim scope.

SUMMARY

According to an embodiment, a high-voltage electrical system has a high-voltage electric power source, an electrical load disposed electrically across the electric power source so that the electric power source provides electric power to the electrical load, a first electrical terminal, at least one first electrical component, and a second electrical terminal and at least one second electrical component. The first at least one electrical component is disposed and configured so that the first at least one electrical component passes at most a low level electric current to the first electrical terminal when a short circuit between the first electrical terminal and a portion of an electric circuit including the electric power source and the electrical load that has a high voltage level completes an electric circuit that includes the first at least one electrical component and the electric power source. The second at least one electrical component is disposed and configured so that the second at least one electrical component passes at most a low level electric current toward the second electrical terminal when a short circuit between a portion of an electric circuit including the electric power source and the electrical load that has a high voltage level completes an electric circuit that includes the second at least one electrical component and the electric power source.

In another embodiment, a method of testing a high-voltage electrical system within an electric bus includes providing a body supported by a plurality of wheels, at least one electric motor disposed so that the at least one electric motor drives the plurality of wheels, a high-voltage electric power source in electrical communication with the at least one electric motor, an electrical load, including the at least one electric motor, disposed electrically across the electric power source so that the electric power source provides electric power to the electrical load, a first electrical terminal and at least one first electrical component, and a second electrical terminal and at least one second electrical component. The first at least one electrical component is disposed and configured so that the first at least one electrical component passes at most a low level electric current toward the first electrical terminal when a short circuit between the first electrical terminal and a portion of an electric circuit including the electric power source and the electrical load that has a high voltage level completes an electric circuit that includes the first at least one electrical component and the electric power source. The second at least one electrical component is disposed and configured so that the second at least one electrical component passes at most a low level electric current toward the second electrical terminal when a short circuit between a portion of an electric circuit including the electric power source and the electrical load that has a high voltage level completes an electric circuit that includes the second at least one electrical component and the electric power source. A voltage test meter is operatively connected electrically across the first electrical terminal and the second electrical terminal.

In a further embodiment, a high-voltage electrical system has a high-voltage electric power source, an electrical load disposed electrically across the electric power source so that the electric power source provides electric power to the electrical load, a first electrical terminal, a second electrical terminal, a first at least one electrical component electrically disposed between the first electrical terminal and the electric power source and between the first electrical terminal and the electrical load, and a second at least one electrical component electrically disposed between the second electrical terminal and the electric power source and between the second electrical terminal and the electrical load. The first at least one electrical component is configured so that the first at least one electrical component passes at most a low level electric current to the first electrical terminal when a short circuit between the first electrical terminal and a portion of an electric circuit including the electric power source and the electrical load that has a high voltage level completes an electric circuit that includes the first at least one electrical component and the electric power source. The second at least one electrical component is configured so that the second at least one electrical component passes at most a low level electric current to the second electrical terminal when a short circuit between a portion of an electric circuit including the electric power source and the electrical load that has a high voltage level completes an electric circuit that includes the second at least one electrical component and the electric power source.

In another embodiment, an electric bus has a body supported by a plurality of wheels, at least one electric motor disposed so that the at least one electric motor drives the plurality of wheels, a high-voltage electric power source in electrical communication with the at least one electric motor, an electrical load, including the at least one electric motor, disposed electrically across the electric power source so that the electric power source provides electric power to the electrical load, a first electrical terminal, a second electrical terminal, a first at least one electrical component electrically disposed between the first electrical terminal and the electric power source and between the first electrical terminal and the electrical load, and a second at least one electrical component electrically disposed between the second electrical terminal and the electric power source and between the second electrical terminal and the electrical load. The first at least one electrical component is configured so that the first at least one electrical component passes at most a low level electric current to the first electrical terminal when a short circuit between the first electrical terminal and a portion of an electric circuit including the electric power source and the electrical load that has a high voltage level completes an electric circuit that includes the first at least one electrical component and the electric power source. The second at least one electrical component is configured so that the second at least one electrical component passes at most a low level electric current to the second electrical terminal when a short circuit between a portion of an electric circuit including the electric power source and the electrical load that has a high voltage level completes an electric circuit that includes the second at least one electrical component and the electric power source.

In a further embodiment, a high-voltage electrical system has a high voltage electric power source, and an electrical load. Electrical circuitry includes the electric power source and the electrical load so that the electric power source applies high voltage power to the electrical load. At least one switch is disposed in the electrical circuitry upstream from the electrical load with respect to the electric power source so that the at least one switch, in a first switch state, conducts electric current within the electrical circuitry through the at least one switch and, in a second switch state, opens at least part of the electrical circuitry so that the high voltage power is not applied to at least part of the electrical load. A first electrical terminal is connected to a first position, between the at least one switch and the electrical load, in a portion of the electrical circuitry at which high voltage exists when the at least one switch is in the first switch state. A second electrical terminal is connected to a second position, between the at least one switch and the electrical load, in the portion of the electrical circuitry at which high voltage exists when the at least one switch is in the first switch state. Application of a predetermined resistance across the first and second electrical terminals produces a voltage drop across the predetermined resistance that is in a voltage drop first state when the at least one switch is in its first switch state and is in a voltage drop second state when the at least one switch is in its second switch state. The voltage drop first state is different from the voltage drop second state. A first at least one electrical component is electrically disposed between the first electrical terminal and the first position in the electrical circuitry so that the first at least one electrical component passes at most a low level of electric current from the first position to the first electrical terminal when a short circuit between the first electrical terminal and the portion of the electrical circuitry completes an electric circuit that includes the first at least one electrical component and the electric power source. A second at least one electrical component is electrically disposed between the second electrical terminal and the second position in the electrical circuitry so that the second at least one electrical component passes at most a low level of electric current from the second position to the second electrical terminal when a short circuit between the second electrical terminal and the portion of the electrical circuitry completes an electric circuit that includes the second at least one electrical component and the electric power source.

In a still further embodiment, an electric bus has a body supported by a plurality of wheels, at least one electric motor disposed so that the at least one electric motor drives the plurality of wheels, and a high voltage electric power source supported by the body and in electrical communication with the at least one electric motor, wherein the electric power source comprises one or more battery packs. An electrical load includes the at least one electric motor. Electrical circuitry includes the electric power source and the electrical load so that the electric power source applies high voltage power to the electrical load. At least one switch is disposed in the electrical circuitry upstream from the electrical load with respect to the electric power source so that the at least one switch, in a first switch state, conducts electric current within the electrical circuitry through the at least one switch and, in a second switch state, opens at least part of the electrical circuitry so that the high voltage power is not applied to at least part of the electrical load. A first electrical terminal is connected to a first position, between the at least one switch and the electrical load, in a portion of the electrical circuitry at which high voltage exists when the at least one switch is in the first switch state. A second electrical terminal is connected to a second position, between the at least one switch and the electrical load, in the portion of the electrical circuitry at which high voltage exists when the at least one switch is in the first switch state. Application of a predetermined resistance across the first and second electrical terminals produces a voltage drop across the predetermined resistance that is in a voltage drop first state when the at least one switch is in its first switch state and is in a voltage drop second state when the at least one switch is in its second switch state. The voltage drop first state is different from the voltage drop second state. A first at least one electrical component is electrically disposed between the first electrical terminal and the first position in the electrical circuitry so that the first at least one electrical component passes at most a low level of electric current from the first position of the electrical circuitry to the first electrical terminal when a short circuit between the first electrical terminal and the portion of the electrical circuitry completes an electric circuit that includes the first at least one electrical component and the electric power source. A second at least one electrical component is electrically disposed between the second electrical terminal and the second position in the electrical circuitry so that the second at least one electrical component passes at most a low level electric current from the second position to the second electrical terminal when a short circuit between the second electrical terminal and the portion of the electrical circuitry completes an electric circuit that includes the second at least one electrical component and the electric power source.

In another embodiment, a high-voltage electrical system has a high-voltage electric power source, an electrical load disposed electrically across the electric power source so that the electric power source provides electric power to the electrical load, and a test port and at least one electrical component. The at least one electrical component is disposed and configured so that the at least one electrical component passes at most a low level electric current to the test port when a short circuit between the test port and a portion of an electric circuit including the electric power source and the electrical load that has a high voltage level completes an electric circuit that includes the at least one electrical component and the electric power source.

In a further embodiment, an electric bus has a body supported by a plurality of wheels, at least one electric motor disposed so that the at least one electric motor drives the plurality of wheels, a high-voltage electric power source in electrical communication with the at least one electric motor, an electrical load, including the at least one electric motor, disposed electrically across the electric power source so that the electric power source provides electric power to the electrical load, and a test port and at least one electrical component. The at least one electrical component is disposed and configured so that the at least one electrical component passes at most a low level electric current to the test port when a short circuit between the test port and a portion of an electric circuit including the electric power source and the electrical load that has a high voltage level completes an electric circuit that includes the at least one electrical component and the electric power source.

An embodiment of a method of testing a high-voltage electrical system within an electric bus includes the step of providing a body supported by a plurality of wheels, at least one electric motor disposed so that the at least one electric motor drives the plurality of wheels, a high-voltage electric power source in electrical communication with the at least one electric motor, an electrical load, including the at least one electric motor, disposed electrically across the electric power source so that the electric power source provides electric power to the electrical load, and a test port and at least one electrical component. The at least one electrical component is disposed and configured so that the at least one electrical component passes at most a low level electric current to the test port when a short circuit between the test port and a portion of an electric circuit including the electric power source and the electrical load that has a high voltage level completes an electric circuit that includes the at least one electrical component and the electric power source. The method includes operatively connecting a voltage test meter electrically to the test port.

BRIEF DESCRIPTION OF THE DRAWINGS

Figure 1:
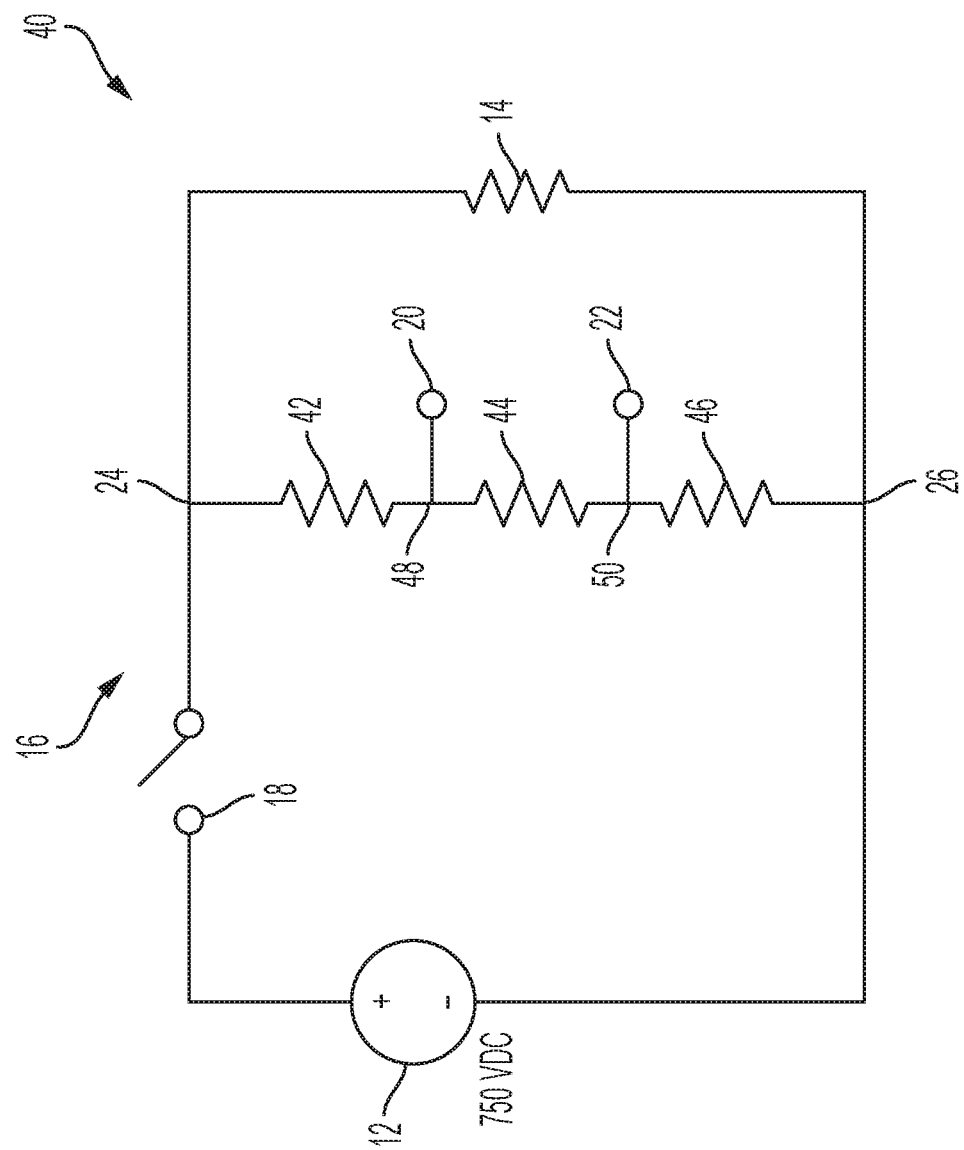
Figure 2:
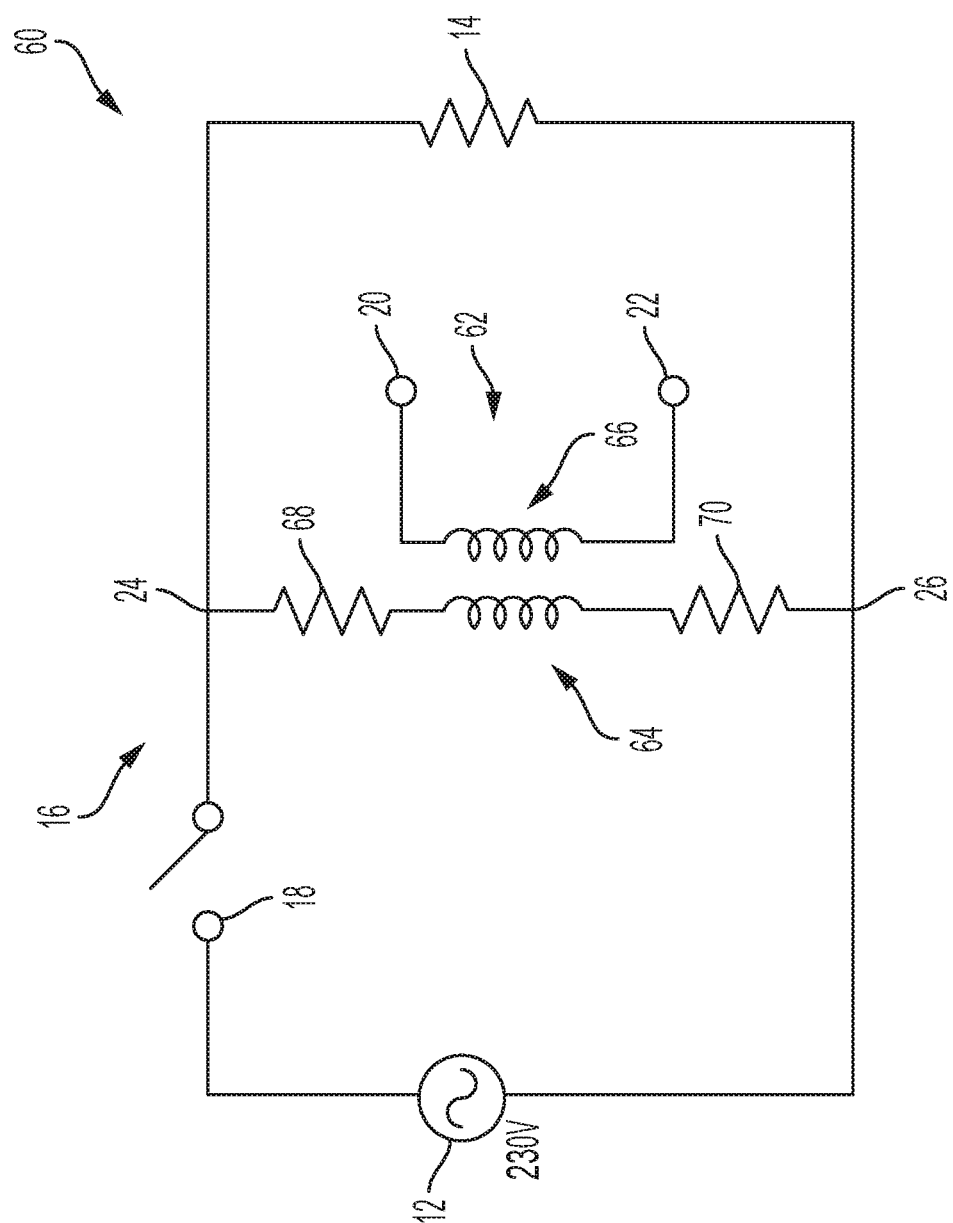
Figure 3:
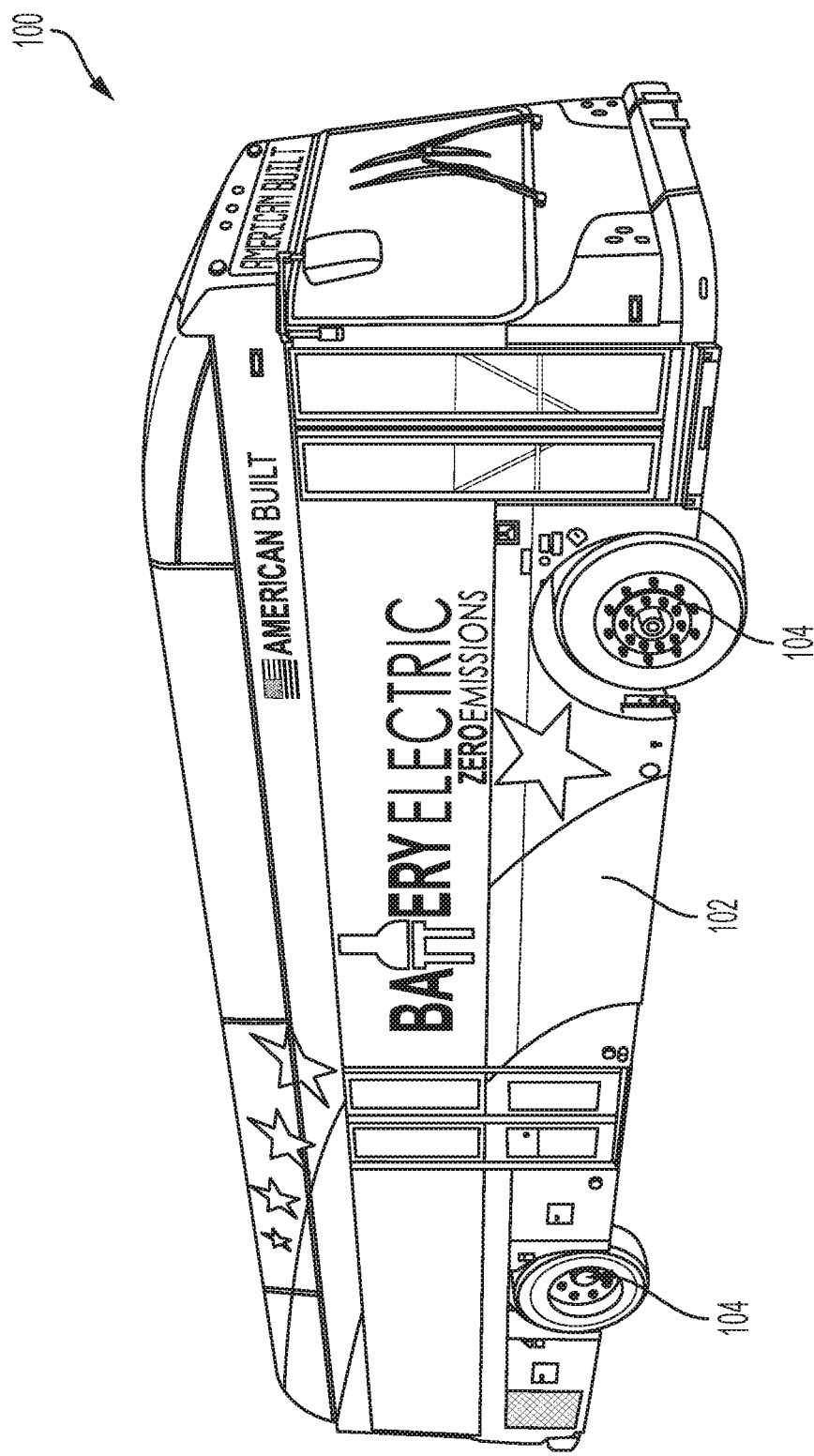
Figure 4A:
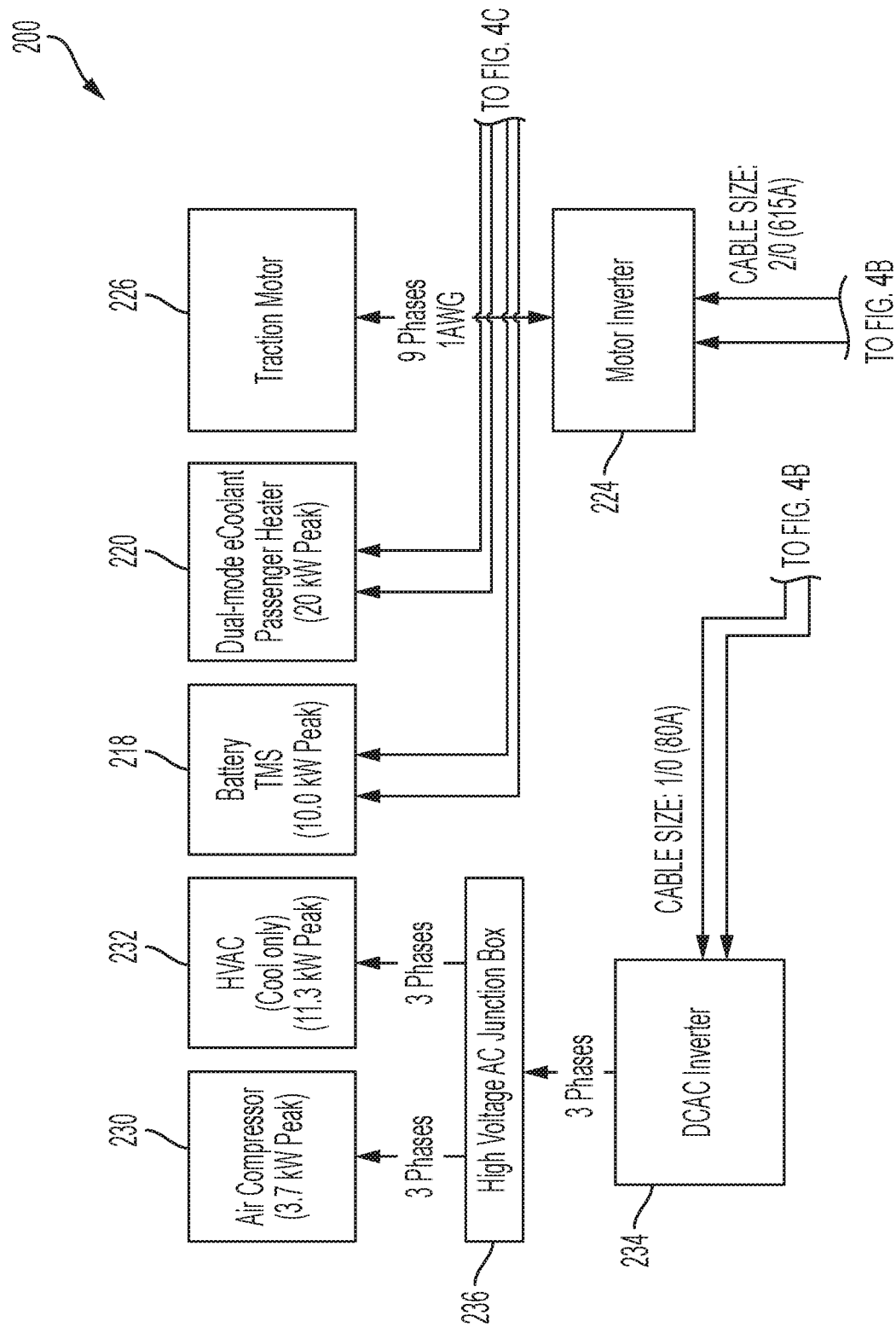
Figure 4B:
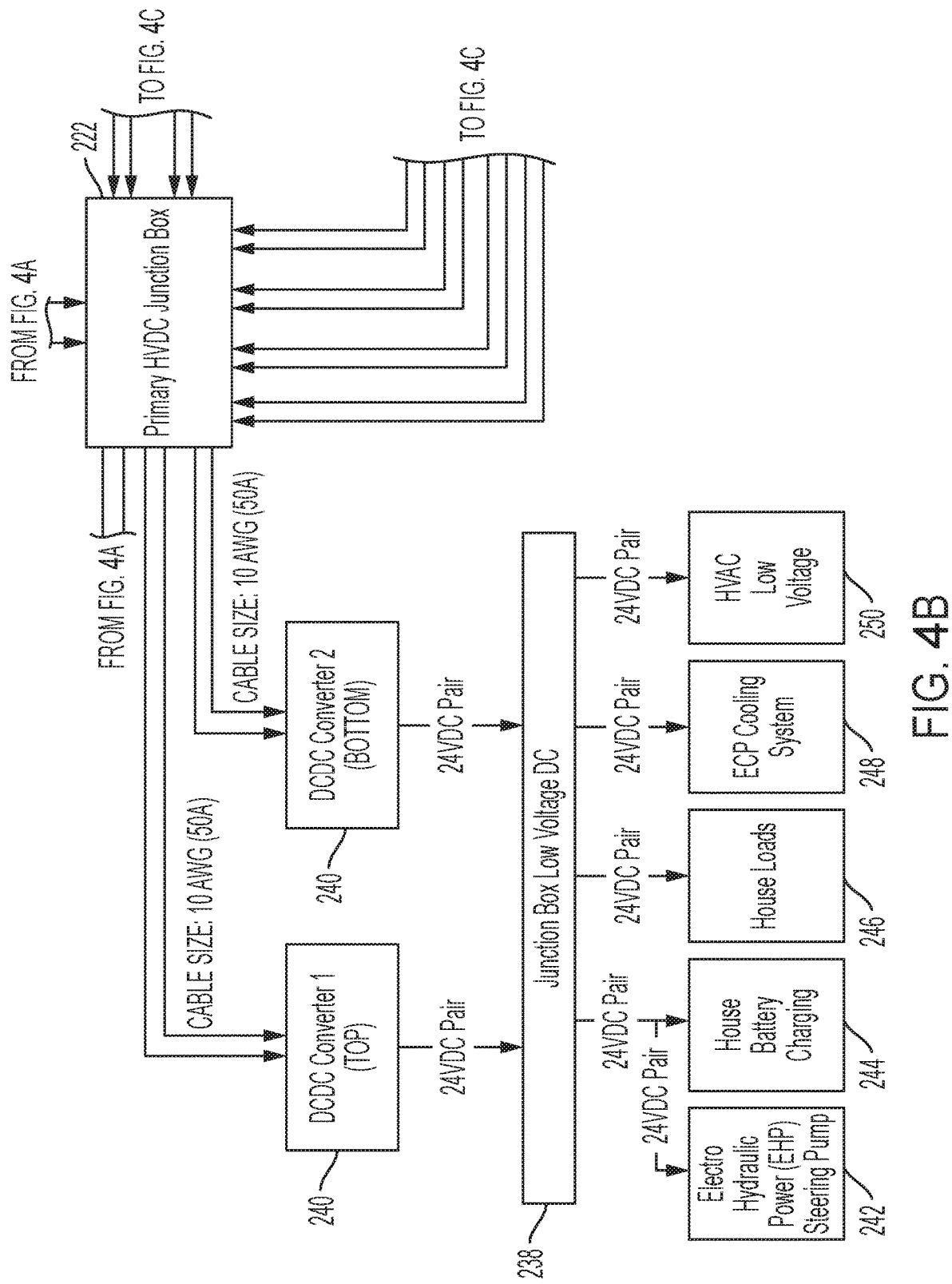
Figure 4C:
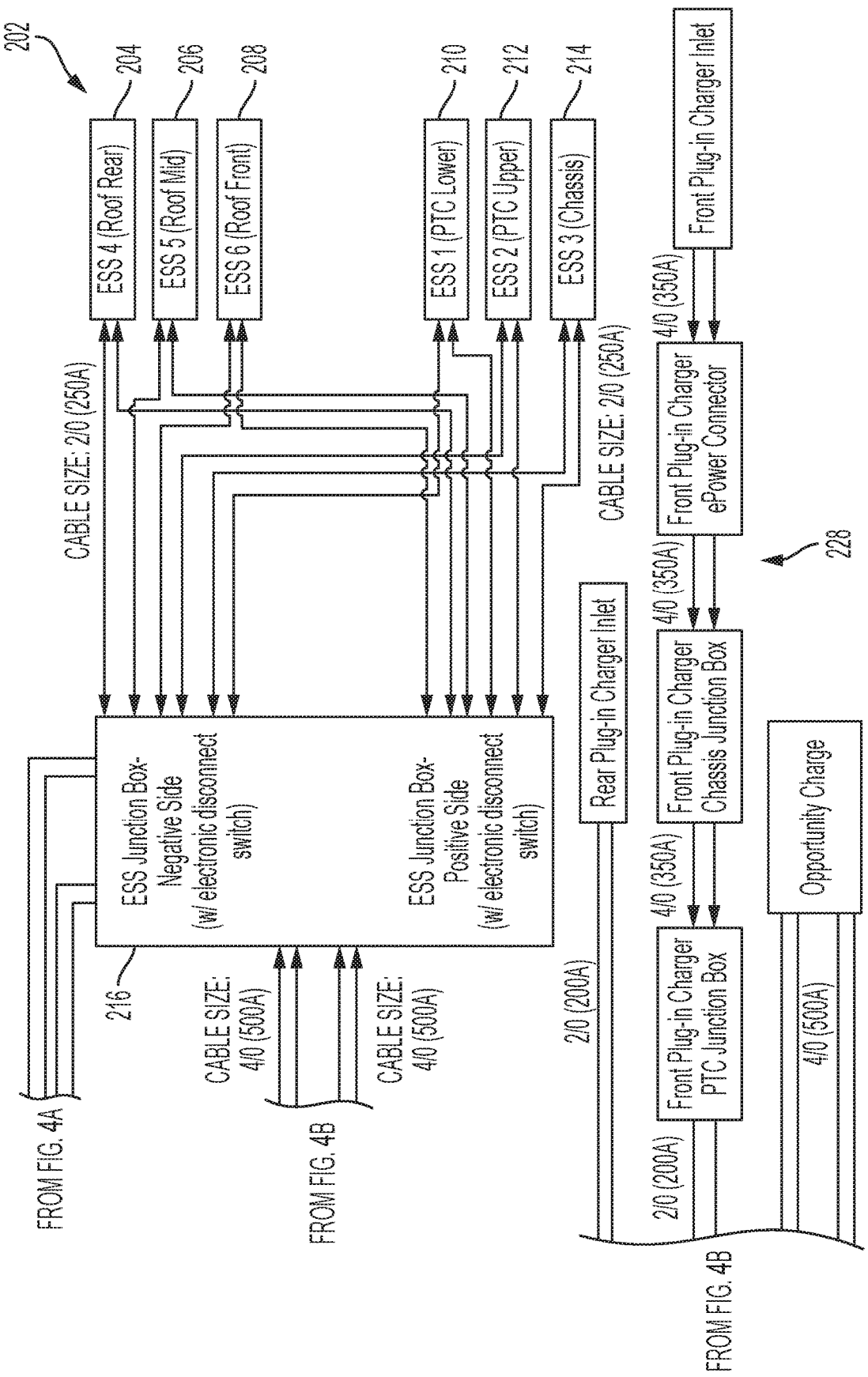
Figure 5A:
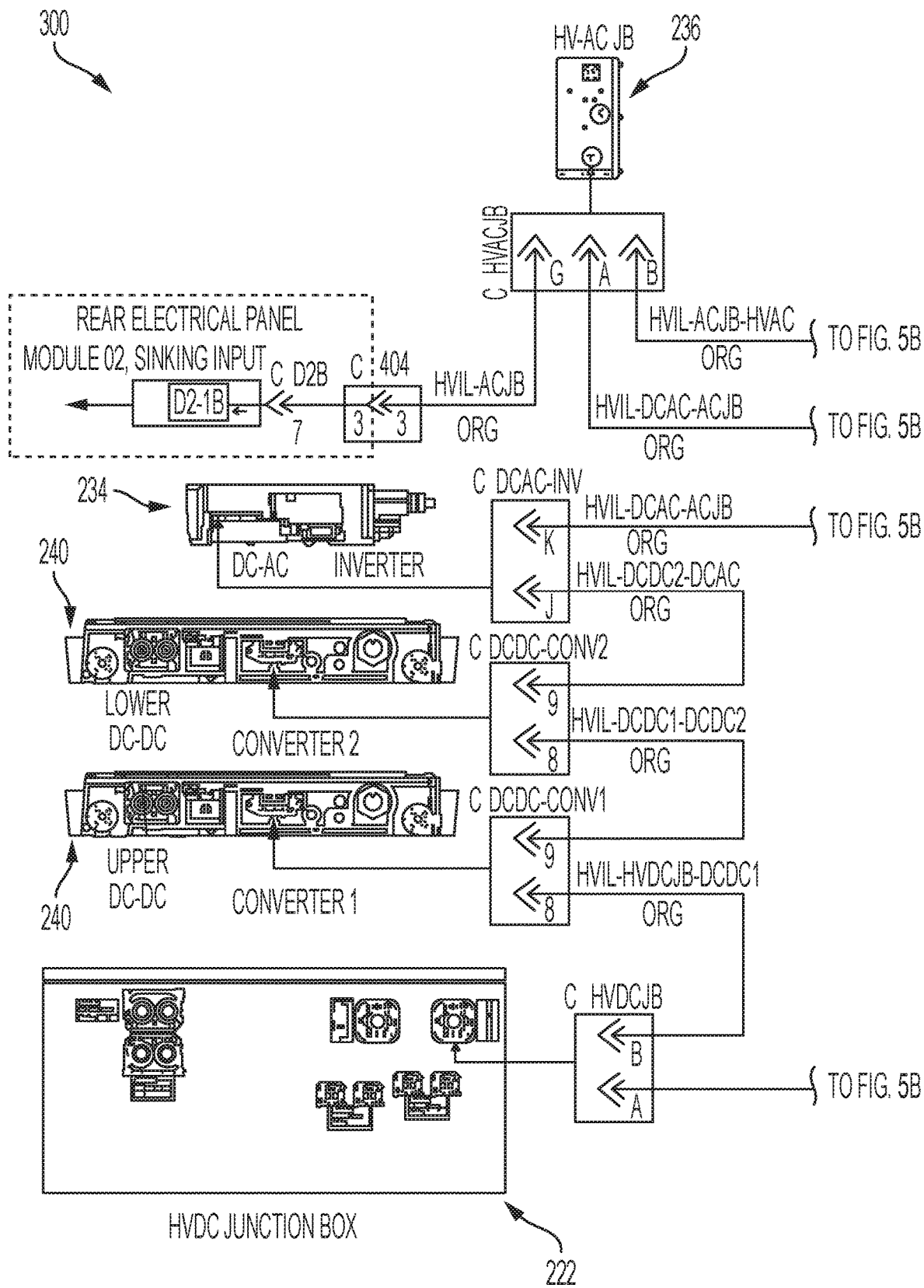
Figure 5B:
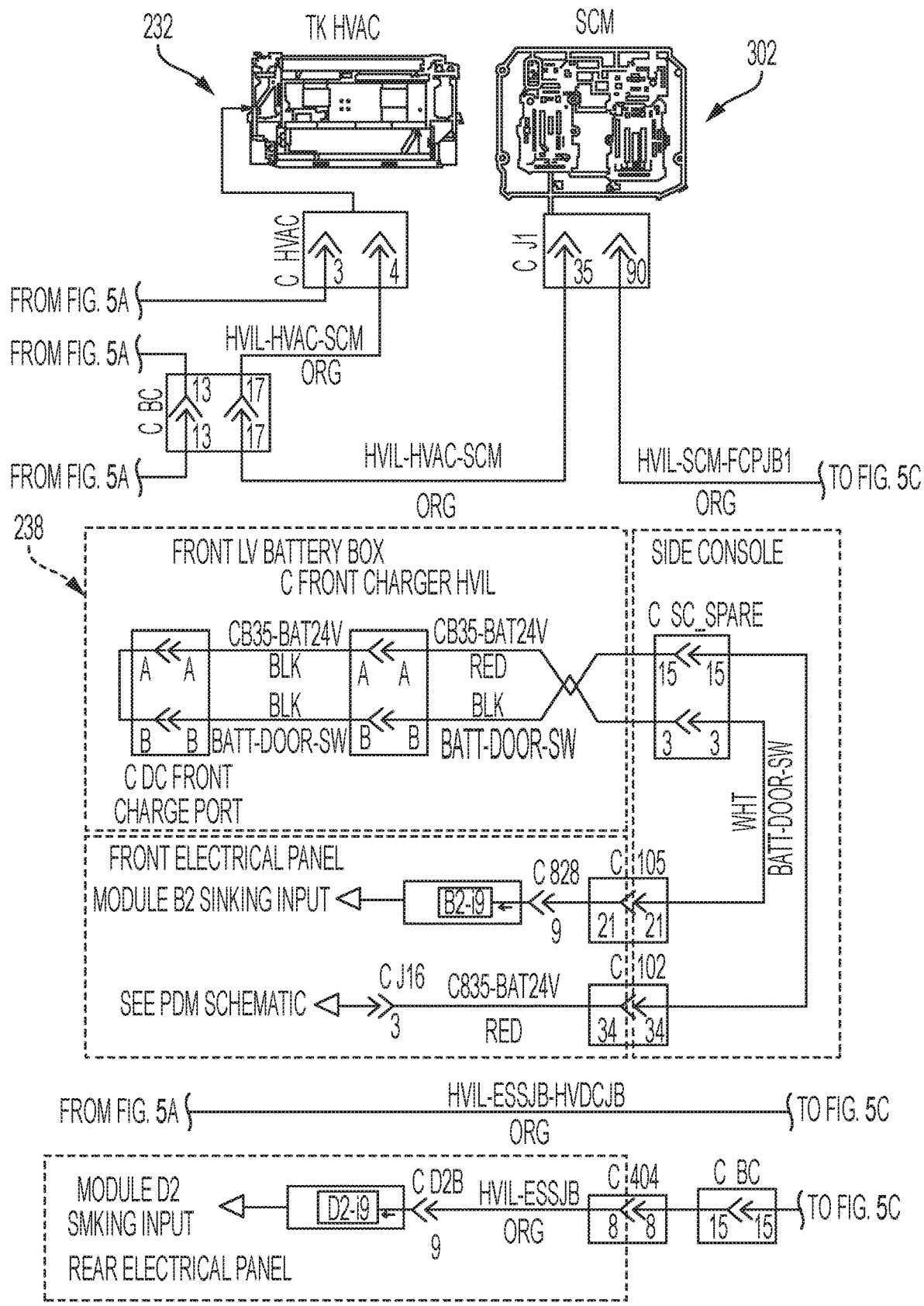
Figure 5C:
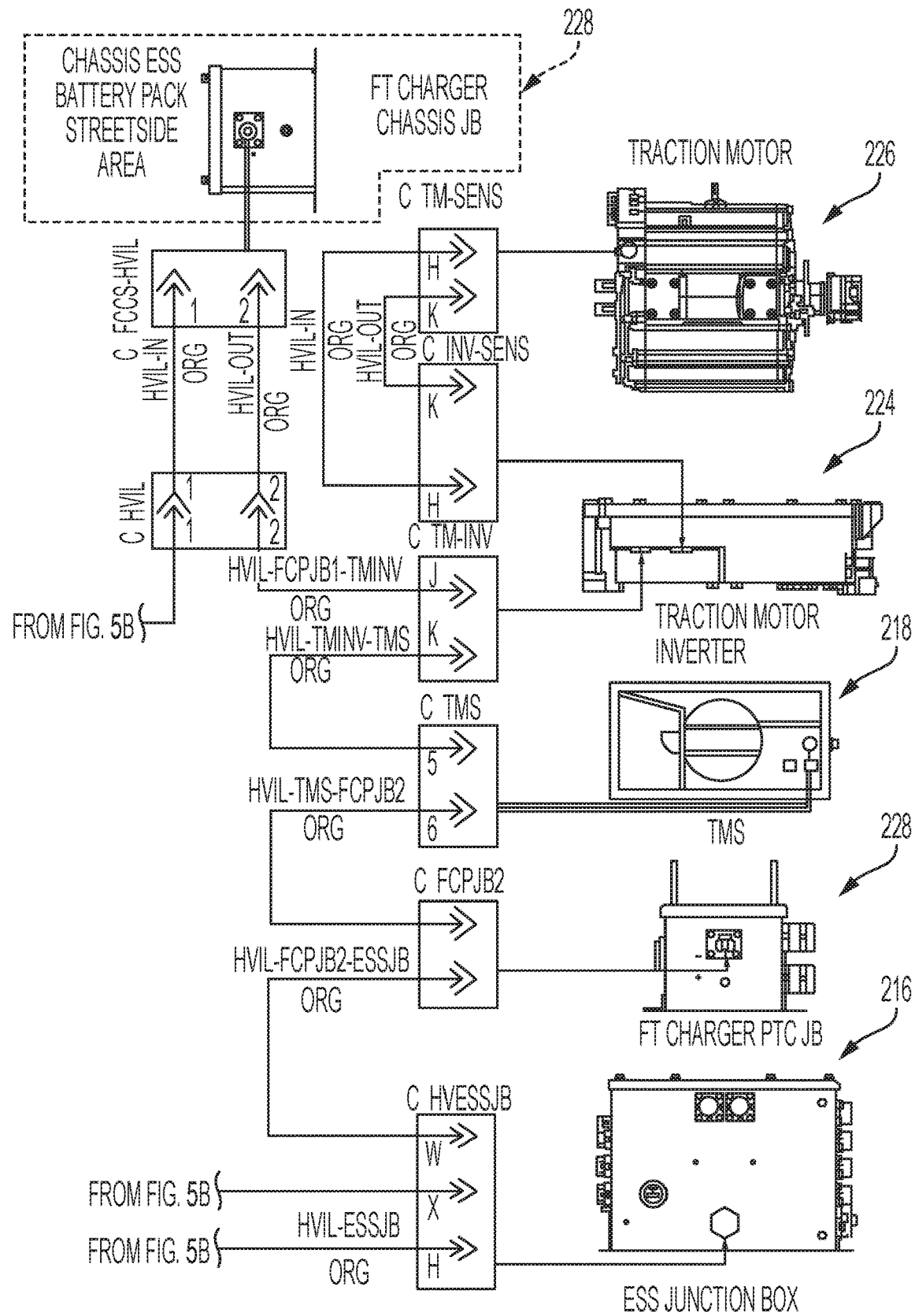
Figure 6:
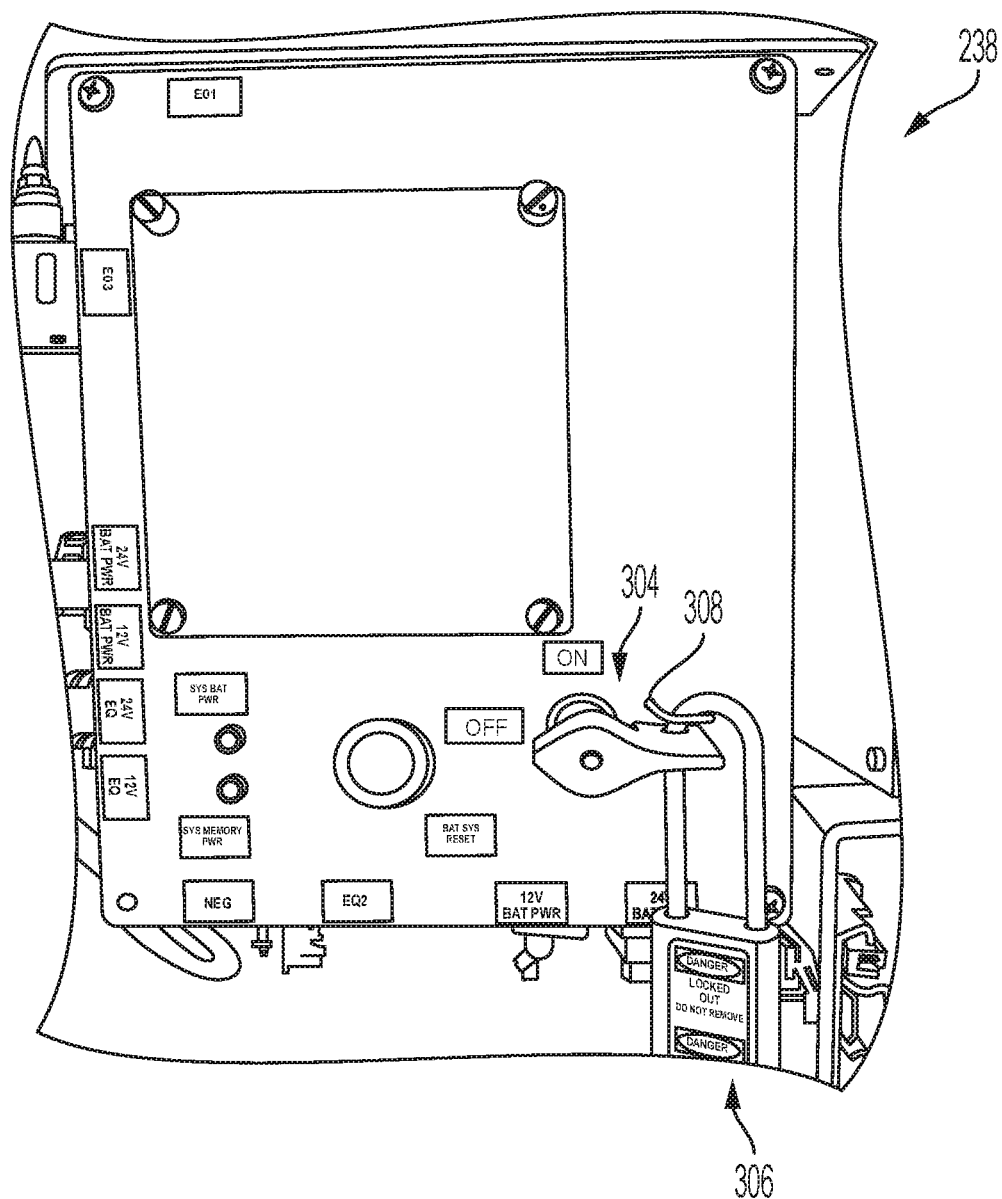
Figure 7:
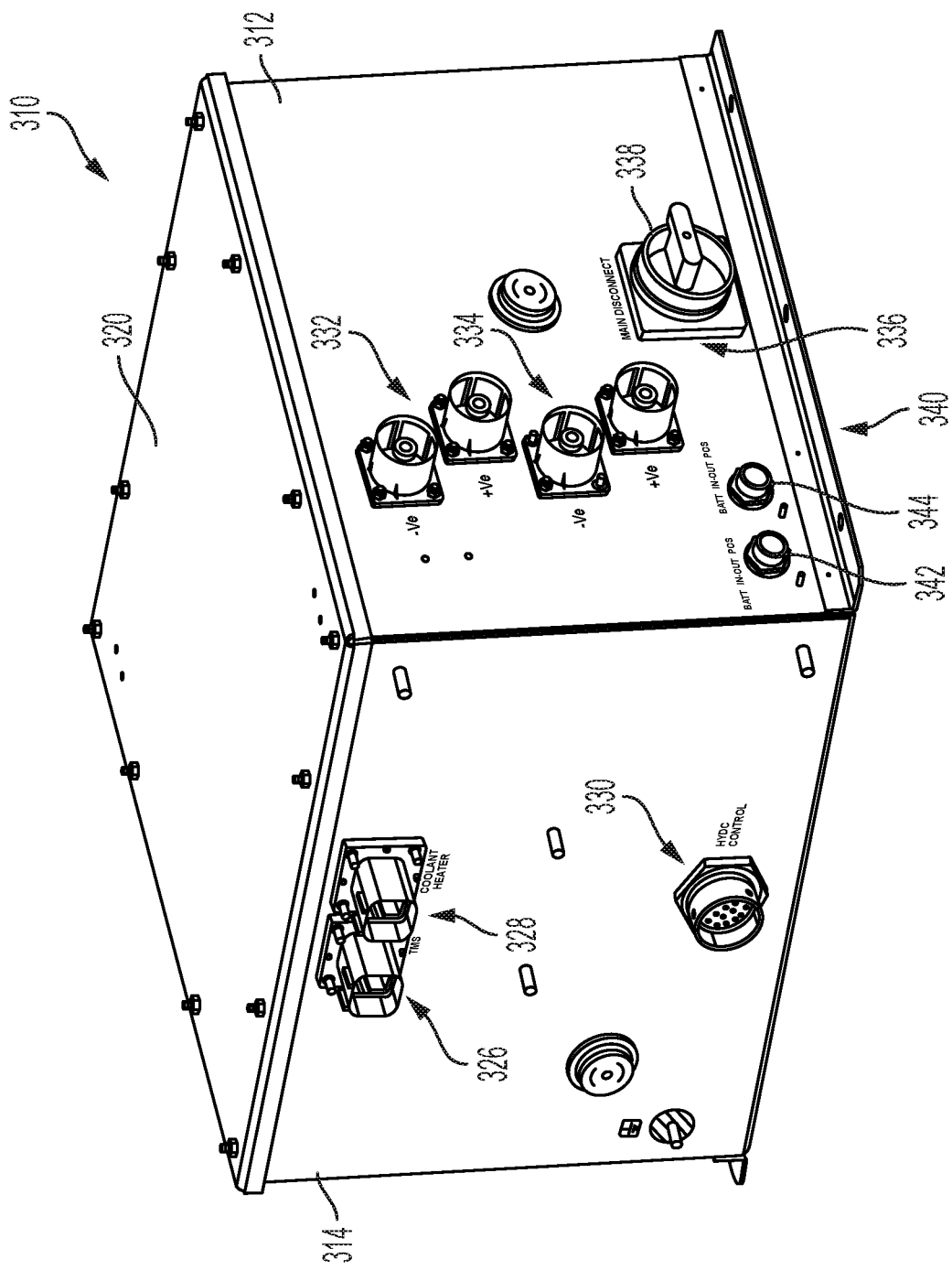
Figure 8:
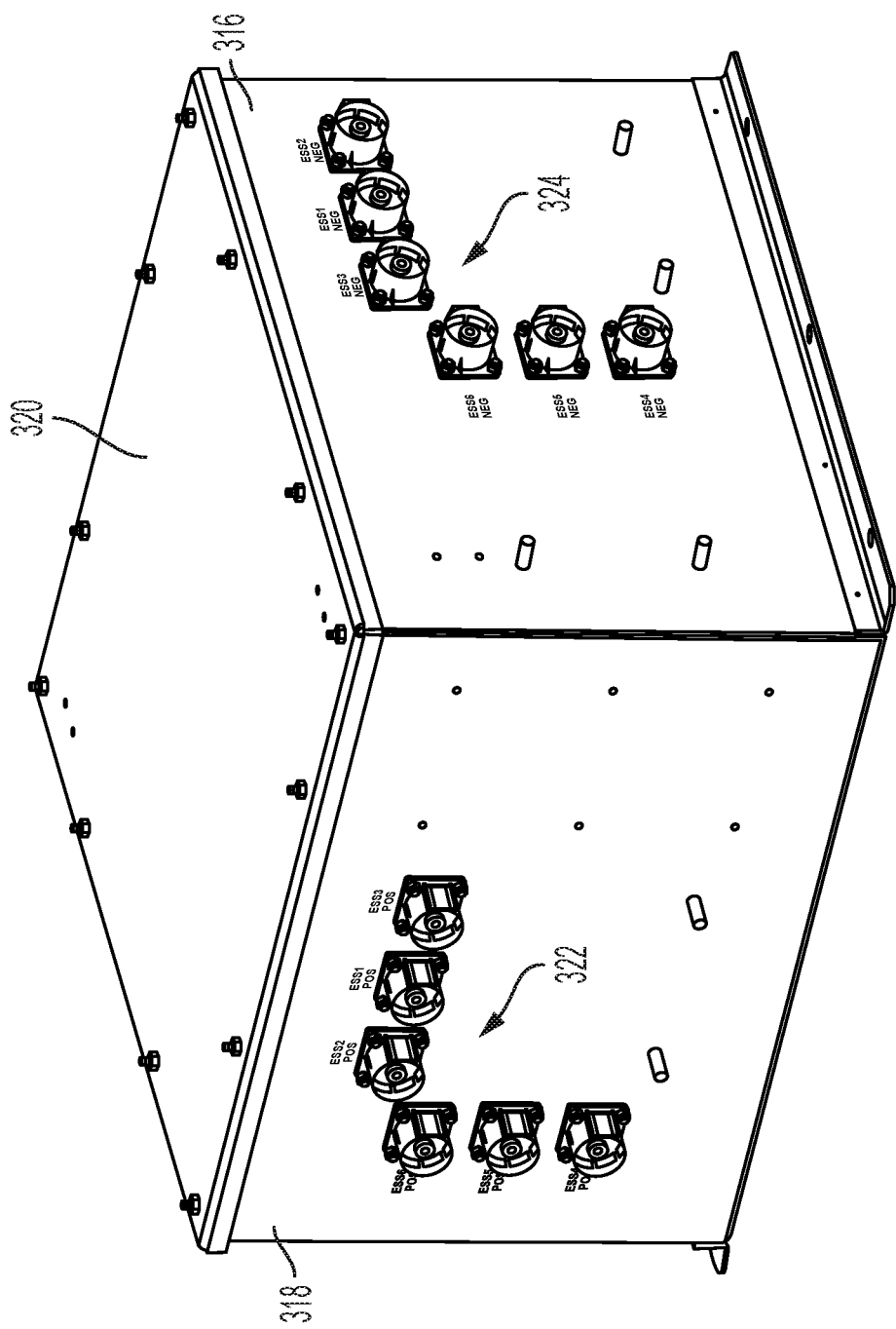
Figure 9:
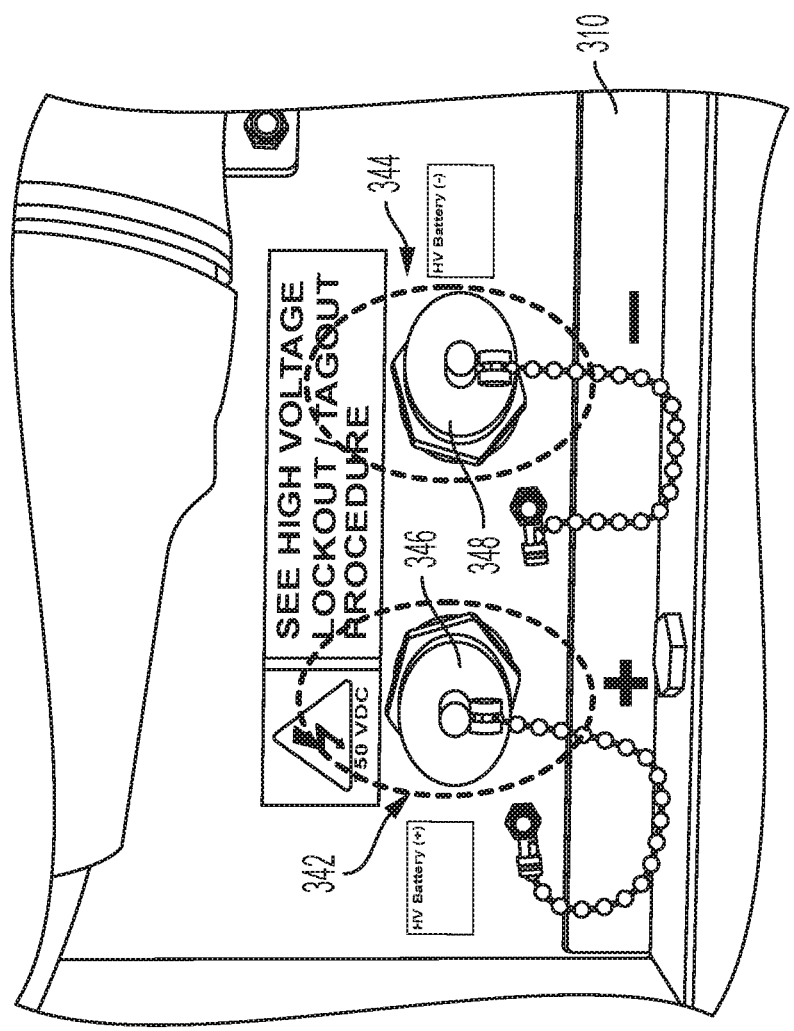
Figure 10:
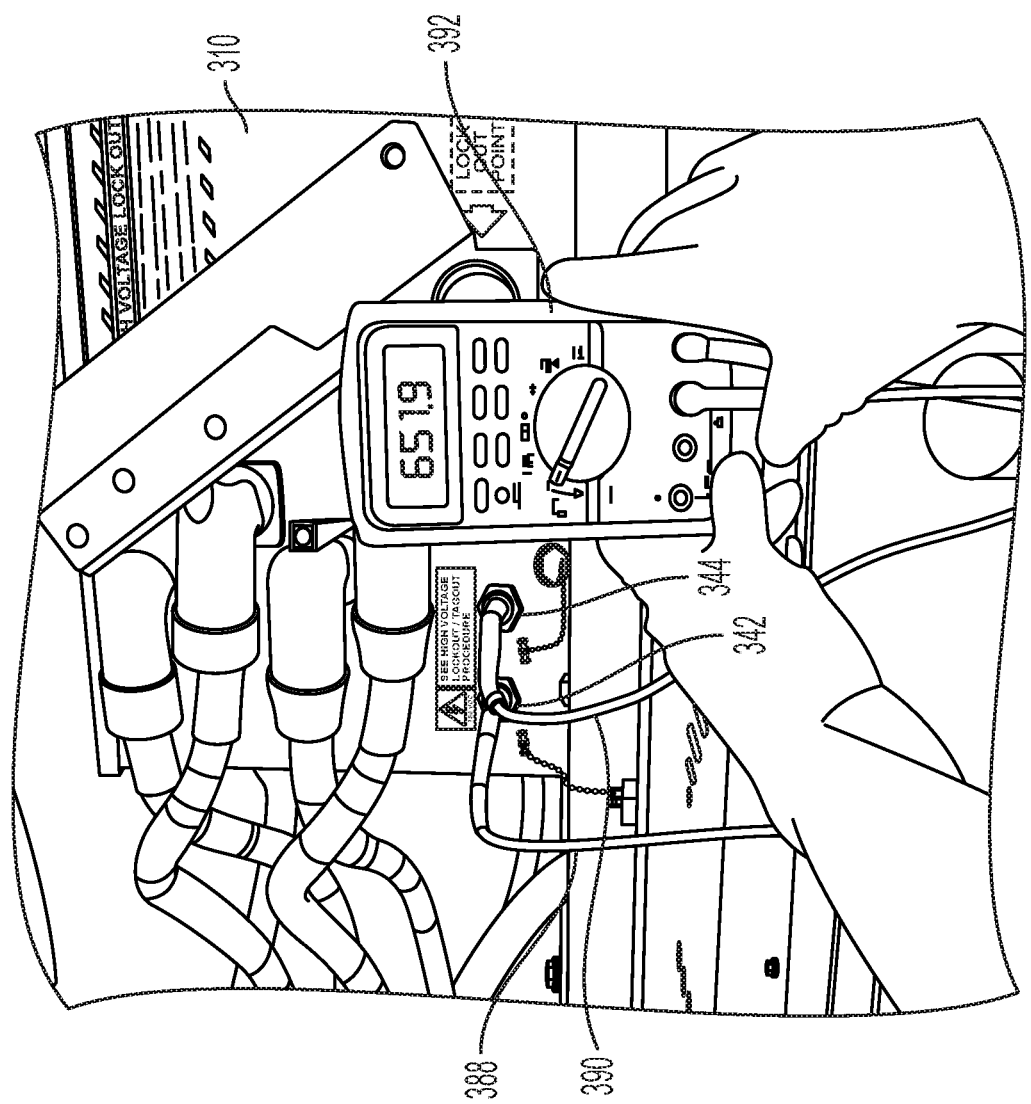

Having thus described some example embodiments in general terms, reference will now be made to the accompanying drawings, which are not necessarily drawn to scale, and wherein:

FIG. 1 is a schematic illustration of circuit diagram of a high-voltage electrical system in accordance with an embodiment of the present disclosure;

FIG. 2 is a schematic illustration of a circuit diagram of a high-voltage electrical system in accordance with an embodiment of the present disclosure;

FIG. 3 is a perspective view of one example of an electrically-powered vehicle with which embodiments of the present disclosure may be used;

FIGS. 4A-4C present a block diagram of one example of a high-voltage and accessory architecture of an electrically-powered vehicle with which embodiments of the present disclosure may be used;

FIGS. 5A-5C present a circuit diagram of one example of a high-voltage interlock loop that may be used with the high-voltage and accessory architecture of FIGS. 4A-4C;

FIG. 6 is a perspective view of one example of a low voltage junction box including one example of a low voltage disconnect that may be used with the high-voltage and accessory architecture of FIGS. 4A-4C;

FIGS. 7 and 8 are perspective views of opposing sides of one example of an energy storage system junction box comprising a test port in accordance with an embodiment of the present disclosure;

FIG. 9 is a detail view of one example of an energy storage system junction box comprising a test port in accordance with an embodiment of the present disclosure, wherein test port access covers are engaged; and FIG. 10 is a perspective view of the energy storage system junction box of FIG. 9 wherein an operator is using the test port with a multimeter.

Repeat use of reference characters in the present specification and drawings is intended to represent same or analogous features or elements of embodiments of the present invention.

DETAILED DESCRIPTION

Reference will now be made in detail to present embodiments of the disclosure, one or more examples of which are illustrated in the accompanying drawings. Each example is provided by way of explanation of the disclosure, not limitation of the disclosure. In fact, it will be apparent to those skilled in the art that modifications and variations can be made in the present disclosure without departing from the scope or spirit thereof. For instance, any number of features illustrated or described as part of one embodiment may be used on another embodiment, in any combination, to yield a still further embodiment. Thus, it is intended that the present disclosure covers such modifications and variations as come within the scope of the appended claims and their equivalents.

Further, either of the terms "or" and "one of and," as used in this disclosure and the appended claims is intended to mean an inclusive "or" rather than an exclusive "or." That is, unless specified otherwise, or clear from the context, either of the phrases "X employs A or B" and "X employs one of A and B" is intended to mean any of the natural inclusive permutations. That is, either phrase is satisfied by any of the following instances: X employs A; X employs B; or X employs both A and B, regardless whether the phrases "at least one of A or B" or "at least one of A and B" are otherwise utilized in the specification or claims. In addition, the articles "a" and "an" as used in this application and the appended claims should generally be construed to mean "one or more" unless specified otherwise or clear from the context to be directed to a singular form. Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," or the like, as used herein does not necessarily refer to the same embodiment, although it may.

Embodiments of the present disclosure comprise apparatus, systems, and methods for performing test measurements on and/or ensuring that an electrically safe working condition exists in a high-voltage electrical system. In various embodiments, a test port is provided as part of the electrical circuitry of a high-voltage electrical system so that an operator can ensure that high voltage is not present in some or all of the high-voltage electrical system. The high-voltage electrical system comprises a high-voltage electric power source that may have a ground connection or that may be electrically isolated from non-circuitry components of the environment in which the high-voltage system exists. The high-voltage source applies power to an electrical load, with the result that there is at least part of the overall circuitry within the system that that, when operative, may have high voltages and may carry a high electric current between the high voltage power source and the load. In some embodiments, the test port is accessible to a human operator. In such embodiments, the test port is disposed in electrical communication with that portion of the electrical circuitry at which high voltages exist so that, in the event of a short circuit (e.g. caused by or through the human operator) between the test port and the power delivery portion of the circuitry that completes an electric circuit that includes the highest level power source in the circuitry, the electric current at the test port is low. In the embodiments discussed herein, the test port is electrically connected to a portion of the power delivery circuitry at which the highest possible voltage levels could occur. Thus, for example, where the highest possible voltage level in the power delivery circuitry is known, and an assumption is made that this highest possible voltage level will be present at the point at which the test port connects to the power delivery circuitry and that the lowest voltage point will be at the terminal, then a resistance may be disposed electrically in series between the test port and that connection so that the electric current at the test port is, at most, a low level electric current so that the human operator should not be injured. In the embodiments discussed below, the highest voltage level in the power delivery circuitry is approximately 750V, and the resistance between that circuitry and the test port is approximately 150 kΩ or greater, so that under Ohm's Law, the electric current at the test port is, at most, 5 mA. In certain embodiments, the high-voltage electrical system is a component of an electrically-powered vehicle, including but not limited to a passenger bus, and the electric power source includes one or more battery packs. In some embodiments, use of the test ports may allow an operator to test the high-voltage electrical system without wearing an arc-flash suit.

Although some embodiments are discussed below in the context of a battery electric bus, those of skill in the art will appreciate that the present disclosure is not so limited. In particular, it is contemplated that embodiments of the present disclosure may be used with any suitable high-voltage electrical system, including high-voltage electrical systems in vehicles, buildings, power plants and grids, among other applications. Electrically-powered vehicles with which embodiments of the present disclosure may be used include, but are not limited to, battery electric and/or gasoline- or diesel-electric hybrid cars, trucks, and buses, or any other vehicle having electrical systems where high voltages are present.

In this regard, FIGS. 1-2 present schematic circuit diagrams of high-voltage electrical systems in accordance with various embodiments of the present disclosure. Turning first to FIG. 1, a high-voltage electrical system 40 includes an electric power source 12 and an electrical load 14. In various embodiments, electric power source 12 is a high-voltage power source operative to supply power at high voltages to electrical load 14. In the embodiment shown in FIG. 1, power source 12 is a seven hundred and fifty volts direct current (750 VDC) power source, e.g. used in an electric vehicle such as a bus, that is electrically isolated from vehicle systems other than those incorporated in the vehicle's high-voltage system. Thus, e.g., power source 12 is electrically isolated from the vehicle chassis and is thereby isolated from chassis ground.

As used herein, the terms "high-voltage" and "high-voltage power" refer to electrical energy at voltage drops across individual components or groups of components of the electrical load above approximately fifty volts AC (50 VAC) or fifty volts DC (50 VDC). As used herein, an "electric power source" may include, e.g., a battery source such as one or more battery packs, mains power, an AC power source, and related circuitry, e.g. inverter or resistor networks, transformers, or power supplies, to provide an operative power supply to an electrical load. In various embodiments, an electric power source may also include secondary sources of residual energy, such as flywheels, capacitors, inductors (or components with capacitors or inductors), and/or motor back EMF. An "electrical load" comprises one or more electrical components of a high-voltage electrical system that consume electric power from the electric power source in the system's normal operation. In the illustrated example, high-voltage electrical system 40 includes electrical circuitry 16 that provides electrical communication between, and includes, electric power source 12 and electrical load 14. Thereby, electric power source 12 applies high-voltage power to electrical load 14.

Also as shown in FIG. 1, a switch 18 is disposed in electrical circuitry 16 upstream from electrical load 14 with respect to electric power source 12. As used herein, the term "switch," with regard to electrical circuits, refers to a device that operatively exists in at least two states, one of which opens flow of electric current in at least a part of the electrical circuitry, and one of which conducts such flow. The switch, e.g. a lever-operated switch or an electrical contactor, may be self-contained in a housing, such that the actuator, e.g. mechanical force applied by an operator to a switch handle or electromagnetic force, changes the switch's state without removal of components from the housing. A switch, e.g. a manual service disconnect (MSD), may also be operated by removing a part of the switch to open the switch and replacing the part to close the switch. Thus, it will be understood that the switch may comprise various current disconnect devices operated, e.g., by any of various electrical, mechanical, magnetic, electromechanical, or electromagnetic components and arrangements. Accordingly, in high-voltage electrical system 40 switch 18, in a first (e.g., closed) state, conducts electric current within electrical circuitry 16 through switch 18. In a second (e.g., open) state, switch 18 opens at least part of electrical circuitry 16 so that the high voltage power is not applied to at least part of electrical load 14. Although a single switch 18 is shown in FIG. 1, those of skill in the art will appreciate that high-voltage electrical system 40 comprises at least one switch 18 and, in some embodiments, will comprise a plurality of switches 18. As described in greater detail below, switch(es) 18 may include, among other things, safety devices an operator may use prior to performing maintenance on system 40 or components thereof.

As noted above, in embodiments of the present disclosure, a high-voltage electrical system may comprise at least one test port to allow an operator to determine whether an electrically safe working condition exists in the electrical system, or a portion thereof. The test port comprises a pair of electrical terminals. The terminals are respectively connected to the power delivery portion of electrical circuitry 16 at positions opposing each other across at least one component of the electrical load between the at least one switch and the electrical load. For instance, as shown in FIG. 1, high-voltage electrical system 40 has a test port comprising two terminals 20, 22 that connect into the high-current-carrying portion of electrical circuitry 16 at positions 24 and 26, respectively. Terminals 20, 22 may be any suitable point connections for closing an electrical circuit. Positions 24, 26 comprise any suitable electrical connection known to those of skill in the art. It should also be understood that, in the embodiment illustrated in FIG. 1 (and similarly to FIG. 3), electric current will always flow through the circuit branch defined by resistors 42, 44, and 46. In other embodiments, a switch, e.g. a high voltage relay, may be provided in this circuit branch in series, e.g. adjacent connection point 24, that will be normally open but that the operator will close in order to conduct a test as set forth herein.

Additionally, and as described in greater detail below, in the embodiment shown in FIG. 2, electrical circuitry 16 of high-voltage electrical system 40 also comprises resistors 42, 44, and 46. Resistors 42, 46 are electrically disposed in series between a respective terminal 20, 22 and respective positions 24, 26. As illustrated in FIG. 1, an open circuit is defined between terminals 20, 22 opposite resistors 28, 30. The open circuit prevents flow of electric current through resistors 28, 30 and across terminals 20, 22 (and between positions 24 and 26 through the resistors and/or the terminals) during the power delivery circuitry's normal operation unless the operator electrically connects the terminals to each other, e.g. with a multimeter or other voltage test device through insertion of the meter's probes into respective terminals 20, 22. In the embodiment of FIG. 2, the resistance of each resistor 42, 46 is up to approximately 1 MΩ, while the resistance of resistor 44 is of at least an order of magnitude smaller, e.g. approximately 10.7 kΩ or 150 kΩ, although it should be understood that resistor 44 may have a resistance comparable to or larger than resistances 42, 46. As explained in more detail herein, those of skill in the art will appreciate that the resistance values for resistors 42, 46 may be different in other embodiments, e.g. depending on the voltage of power source 12 and the specific configuration of electrical circuitry 16, among other factors.

The test port may take various forms within the scope of the present disclosure, as those of skill in the art will appreciate. In some embodiments, the test port may include terminals disposed within respective suitable connectors (e.g., an IP rated connector that is configured to receive test leads of a test instrument, such as a multimeter) coupled with a junction box that is accessible to an operator. Likewise, and for example, the positions 24, 26 at which terminals 20, 22 are connected may be respective busbars disposed within the junction box. The junction box, in turn, allows the operator to interact with the terminals 20, 22 but prevents the operator's interaction with the circuit components within the junction box. Accordingly, the present discussion addresses the possibility of short circuit conditions at the terminals.

In one aspect of the present disclosure, the electrical terminals are connected at respective positions across any of various components present in the electrical circuitry through which power source 12 provides electric power to load 14 and that may define high voltages and carry high current. These respective positions are between one or more of the one or more switches and the electrical load such that application of a predetermined resistance across the electrical terminals produces a first voltage drop across the predetermined resistance during the circuit's normal operation when the at least one switch is in its first (e.g., closed) state and produces a second, different voltage drop when the at least one switch is in its second (e.g., open) state. For example, when the at least one switch is closed, the voltage drop across the predetermined resistance may be higher than the voltage drop across the predetermined resistance when the at least one switch is open (in the embodiment of FIG. 1, the voltage drop should be zero when the switch is open, unless the load includes a power source). As those of skill in the art will appreciate, the component across which the electrical terminals are connected, and the positions within the electrical circuitry at which the terminals are connected, may vary in various embodiments. Many different configurations are within the scope of the present disclosure, provided that the two states of the voltage drop across such components are distinguishable based on the testing method used by the operator.

In certain embodiments described herein, e.g., the terminals are attached to positions in the electrical circuitry providing power from between the power source to the load so that the test port terminal circuitry is electrically in parallel with both the electric power source and the electrical load. As such, the voltage drop across a test resistance, e.g. the resistance of resistor 44 in FIG. 1, disposed electrically across the terminals may be directly related to the open circuit voltage of electric power source 12 (if all of the one or more switches upstream from the measurement terminals is/are closed). Thus, if the values and/or relationship among the test resistance and the resistances/impedances of components between the test resistance and the power delivery circuitry are/is known, and the electric power source's open circuit voltage is known, the relationship between the electric power source's open circuit voltage and the voltage drop measurement produced by the testing device connected across the terminals may be defined, and therefore known, through solving for the testing device resistance's voltage in the resulting voltage divider network. With this information, the operator may define a voltage measurement value at the testing device that may be interpreted as a dividing line between a determination that the electric power source may be electrically connected to the load via the high voltage circuitry and a determination that the electric power source is not so connected. It should be understood, in view of the present disclosure, that the predetermined resistance of the test resistance need not be known by the operator, provided the operator has been informed of the dividing-line voltage.

In the example of FIG. 1, connection of terminals 20, 22 to the power delivery circuitry at positions 24, 26 places terminals 20, 22 and the test circuit in parallel with power source 12 and electrical load 14. As a result, the voltage drop across the resistance of a test instrument attached to and extending across terminals 20, 22 may be directly related to the open circuit voltage of electric power source 12, assuming that switch 18 is in its first (e.g., closed) state and taking into consideration the resistor network as illustrated.

As noted above, it will be understood that other arrangements of the electrical terminal 20, 22 positions 24, 26 are possible within the scope of the present disclosure. For example, the electrical terminal positions may be disposed across a resistor or resistor network that is elsewhere in the power delivery circuitry between the one or more switch(es) and the electrical load and that across which the voltage drop, or voltage drop range, is known when all switch(es) are closed and when at least one of the one or more switch(es) is open, such that measurement of the voltage drop across the electrical terminals by a multimeter or other testing device indicates to the operator whether the testing device voltage drop corresponds to the high-voltage circuitry's closed or open states. In any such arrangement, it will be understood in view of the present disclosure that the values or approximate relationships among the resistances/impedances relevant to determining the testing device resistance's voltage drop in view of the electric power source open circuit voltage should be known with respect to the high-voltage electric circuitry's open and closed states, so that the operator may select the measurement device voltage drop demarcation line between the open and closed states.

Additionally, in another aspect of the present disclosure, the test port is designed so that, in the normal operation of the test circuit (e.g. when a multimeter is applied across the terminals) or in the event of a short circuit between one or both of the terminals and any position in the high voltage, or power delivery, circuitry that completes a circuit that includes a high-voltage power source, the electric current flow at the given terminal will be below a level dangerous to humans. The terms "short" and "short circuit" include electric arcs between high-voltage or high-current electrical circuitry and human operators. Thus, in various embodiments, at least one respective electrical component is electrically disposed between a first electric terminal of the pair of the electrical terminals and the positions at which that terminal is connected to the electrical circuitry through the high voltage power source provides electric power to the load and at which high voltages may therefore exist (the "power delivery circuitry") so that the at least one electrical component passes at most a low level electric current from such a connection position to the first electrical terminal when a short circuit exists between the first electrical terminal and a point in the power delivery circuitry that completes an electrical circuit that includes a high voltage power source. Similarly, at least one respective electrical component is electrically disposed between a second electric terminal of the pair of the electrical terminals and the positions at which that terminal is connected to the power delivery circuitry so that the at least one electrical component passes at most a low level electric current from such a connection position to the second electrical terminal when a short circuit exists between the second electrical terminal and a point in the power delivery circuitry that completes an electrical circuit that includes a high voltage power source. As used herein, "low" electric current is approximately five milliamperes (5 mA) or below, while "high" electric current is above approximately 5 mA and particularly above approximately 10 mA.

As shown in FIG. 1, for example, resistor 42 is electrically disposed between electrical terminal 20 (see position 48) and position 24 in the power delivery circuit. If a short occurs between point 48 and a position in the power delivery circuitry in communication with the negative pole of source 12 (e.g. via the operator) to thereby complete an electric circuit that includes resistor 42 and power source 12, and assuming the resistance of resistor 42 is approximately 1 MΩ, current through resistor 42 and at terminal 20 would be at most approximately 0.75 mA under Ohm's Law. If the resistance of resistor 42 is approximately 150 kΩ, the current would be at most approximately 5 mA. Similarly, resistors 44 and 46 are electrically disposed between electrical terminal 20 and position 26 in the power delivery circuitry. If a short occurs between point 48 and a position in the power delivery circuitry in communication with the positive pole of source 12 to thereby complete an electric circuit that includes resistors 44, 46 and power source 12, and assuming the resistance of resistor 46 is approximately 1 MΩ and that the resistance of resistor 44 is approximately 10.7 kΩ, electric current through resistors 44, 46 would be at most approximately 0.74 mA. If the resistance of resistor 46 is approximately 150 kΩ, the current would be at most approximately 4.7 mA. With regard to terminal 22, resistors 42 and 44 are disposed between it (at point 50) and connection position 24 in the event of a short from point 50 to a position in the power delivery circuitry in communication with the negative pole of source 12 to thereby complete an electric circuit that includes resistors 42 and 44 and power source 12, while resistor 46 is disposed between it (at point 50) and connection position 26 in the event of a short from point 50 to a position in the power delivery circuitry in communication with the positive pole of source 12 to thereby complete an electric circuit that includes resistor 46 and power source 12, with similar, but mirror-image, resulting electric current flows as would occur at the short circuits at point 48 discussed above. Thus, in this embodiment, each of resistors 42 and 46 has a resistance above approximately 150 kΩ and may have a resistance between approximately 150 kΩ and 1 MΩ. The foregoing discussion assumes that the highest possible voltage level in the high current level circuitry that includes the power source and the load is the voltage drop across the power source, in this instance 750 VDC. It should be understood that such discussion is for purposes of explanation only and that if there are additional power sources within the high current portion of the circuitry, the power sources could accumulate in order to define the highest possible voltage level that either of the terminals could see at the point where the terminal communicates with that circuitry at points 24 and 26 (which, in the embodiments discussed herein, is the highest possible voltage that exists in the circuitry as it normally operates). In that event, the value of the intervening series resistor 42, 46 could be determined under Ohm's Law so that a maximum electric current level at the respective terminal is no more than a maximum low electric current level, e.g. 5 mA.

The foregoing discussion assumes that switch 18 is in the first (e.g., closed) position. However, if switch 18 is in the second (e.g., open) position, then no current should flow in the event of a short, as described above, or connection of a testing device, such as a multimeter. Assuming an approximately 750 VDC power source 12, that switch 18 is closed, that the resistance of each of resistors 42 and 46 is approximately 1 MΩ, and that the resistance of resistor 44 is approximately 10.7 kΩ, if an operator applies the probes of a multimeter to terminals 20 and 22 so that the multimeter measures the voltage across the terminals, the multimeter should detect an approximately 4V voltage drop. If the resistance of resistor 44 is approximately 150 kΩ, the multimeter should detect an approximately 52V voltage drop. If switch 18 is open, the multimeter should detect 0V, so that the distinction between 0V and 4V (or between 0V and 52V, depending on the resistance of test resistor 44) informs the operator of the operative state of the power delivery circuit. In any event, even if either of terminals 20 and 22 is shorted to a point in the power delivery circuit, the operator applying the multimeter to the test port comprising the terminals should be subject to at most a low level electric current. As should be understood, the inherent resistance of multimeters is typically high (e.g. approximately 15 Me), and the multimeter's disposition electrically across terminals 20 and 22 would not materially alter the current determinations set forth in the discussion above.

Similarly, in some embodiments, an LED voltage tester may be configured with a resistance in such circumstances (where the relationship between that resistance and the in-series resistances is known) that the tester may light the LED at a voltage drop across the testing device resistance that is above approximately four volts (4V) or other level, e.g. 52V, depending on the test resistance value. If, however, the testing device's internal resistance is much lower than the in-series resistances of resistors 28 and 30, such that the voltage drop read by the testing device will be much lower than the open circuit voltage of electric power source 12 when all switch(es) 18 are closed, the operator may choose a lower voltage drop dividing line to demark the circuitry's closed state from its open state.

While the discussion above illustrates the use of a DC power source, it should be understood that power source 12 could be an AC power source. It will also be understood, in view of the present disclosure, that the discussion above is applicable to a system having an AC power source at 12, with regard to short circuits between either of points 48 and 50 and the power source.

FIG. 2 is an example of a high-voltage electrical system configuration within the scope of the present disclosure. FIG. 2 is a simplified circuit diagram of a high-voltage electrical system 60 that is similar in certain respects to system 40, described above with respect to FIG. 1. Thus, in FIGS. 1-2, like parts are indicated by like reference numerals.

Referring to FIG. 2, in this embodiment, high-voltage circuitry 16 of system 60 comprises a transformer 62 to step down the voltage at each electrical terminal relative to the voltage at electric power source 12, which is an alternating current (AC) power source in this example. In particular, transformer 62, which comprises a primary winding 64 and a secondary winding 66, is electrically disposed in series between resistors 68 and 70, respectively. (Those of skill in the art will appreciate that resistors 68, 70 need not be provided in all embodiments employing transformer 62.) Resistors 68 and 70, which may be analogous to resistors 28 and 30 described above, are connected to high-voltage circuitry 16 at positions 24 and 26, respectively of FIG. 2. Electrical terminals 20 and 22 are in electrical communication with secondary winding 66 of transformer 62 in any suitable manner familiar to those of skill in the art. As shown, transformer 62, resistors 68, 70, and terminals 20, 22 are connected electrically in parallel to power source 12 and load 14.

As those of skill in the art will appreciate, and as with the embodiment described above with respect to FIG. 1, in the embodiment shown in FIG. 2, terminals 20, 22 are attached to positions in the electrical circuitry such that the voltage drop across the resistance of a testing device attached to and extending across the terminals will be directly related to the open circuit voltage of the electric power source (if all of the one or more switches upstream from the measurement terminals is/are closed), subject to the impact of any electrical components in series between the measurement device resistance and the electric power source terminals. Likewise, in this embodiment, the test port is designed so that, in the event of a short circuit between one of the terminals 20, 22 and a position in the power delivery circuit that completes an electric circuit including the transformer and power source 12, any current flowing through the completed circuit will be below levels that are dangerous to humans.

FIG. 3 is a perspective view of one example of an electrically-powered vehicle 100 with which embodiments of the present disclosure may be used. In this example, vehicle 100 may be a passenger or transit bus, though as noted above embodiments of the present disclosure may be used with many other types of electrically-powered vehicles. It will be appreciated that vehicle 100 comprises a body 102 supported by a wheeled chassis in a body-on-frame construction. However, the present disclosure is not so limited, and in some embodiments vehicle 100 may have a unibody or monocoque chassis construction. As described in more detail below, vehicle 100 also comprises a propulsion system comprising at least one electric motor that is also supported by the wheeled chassis and may comprise individually dedicated motors for the respective wheels. The at least one electric motor drives wheels 104 of the wheeled chassis. Additionally, and also as described below, vehicle 100 comprises an electric power source supported by the wheeled chassis and in electrical communication with the propulsion system. In various embodiments, the electric power source comprises one or more battery packs. Examples of battery packs may be analogous to the lithium ion battery packs offered by various manufacturers, including Cummins Inc. of Columbus, Ind. In one particular embodiment, vehicle 100 is a battery electric bus that is entirely electrically-powered. In other embodiments, vehicle 100 may be a hybrid power bus employing an engine-generator in communication with one or more suitable battery packs.

FIGS. 4A-4C present a block diagram of one example of a high-voltage and accessory architecture 200 of an electrically-powered vehicle with which embodiments of the present disclosure may be used. In particular, architecture 200 comprises the high-voltage components and other electronic accessories of a battery-electric bus, and thus architecture may be used in the electrically-powered vehicle 100 of FIG. 3. As shown, architecture 200 comprises an energy storage system 202. Energy storage system 202 includes a plurality of battery packs, and in this illustrated embodiment six such battery packs 204-214 are provided. Battery packs 204-214 may be, e.g., BP74E Li-ion 74 kWh battery packs offered by Cummins Inc. Battery packs 204-214 may be disposed in a variety of locations on the electric bus and all possibilities are intended to be within the spirit and scope of the present disclosure. In one example, battery packs 204-208 may be disposed on a roof of the battery-electric bus, battery packs 210-212 may be disposed in a powertrain compartment of the bus, and battery pack 214 may be disposed on a lower forward location of the wheeled chassis. In one embodiment, each of battery packs 204-214 comprise two switches, e.g., electrical contactors, inside each battery pack, one for the positive high-voltage output and one for the negative high-voltage output. As will be appreciated, both such contactors must be closed to complete the circuit for high voltage to be available outside of the battery pack.

In any event, battery packs 204-214 are all in electronic communication with an energy storage system junction box 216. Certain aspects of the structure and electrical circuitry of a junction box analogous to junction box 216 in accordance with an embodiment of the present disclosure are discussed in greater detail below with reference to FIGS. 7-8. In general, however, junction box 216 receives and electrically joins positive and negative electrical connections from respective terminals of each battery pack 204-214. Also as described below, junction box 216 comprises two switches, e.g., electrical contactors, respectively in electrical communication with the positive and negative high voltage legs, that may serve to further isolate energy storage system 202 from the rest of the system, including the vehicle chassis. The remaining components of architecture 200 are in electrical communication with energy storage system 202 via direct or indirect connections to junction box 216. In other words, the remaining components, which may be viewed as an electrical load, are electrically disposed in parallel with respect to junction box 216 and with respect to energy storage system 202.

Those of skill in the art are familiar with high-voltage components and accessories in an electrical system of an electrically powered bus, and thus such components are not described in detail herein. In general, though, architecture 200 comprises a battery thermal management system 218 and a coolant heater 220 in electrical communication with junction box 216. Also, in this embodiment, architecture 200 comprises a high voltage direct current (HVDC) junction box 222. As with junction box 216 above, junction box 222 may comprise two switches, e.g., electrical contactors, which serve to disconnect energy storage system 202 from downstream system components.

Certain components of architecture 200 are in electrical communication with junction box 216 via HVDC junction box 222. For example, architecture 200 comprises a motor inverter 224 that is in electrical communication with HVDC junction box 222. Motor inverter 224 provides alternating current to a traction motor 226, which drives the wheels of the bus. Additionally, a plurality of charging inlets 228 are in electrical communication with HVDC junction box 222. Further, HVDC junction box 222 is in electrical communication with an air compressor 230 and a heating, ventilation, and air conditioning (HVAC) system 232. A DC/AC inverter 234 that is electrically disposed between air compressor 230 and HVAC system 232 and HVDC junction box 222 provides AC power to these components, e.g., via a high-voltage alternating current junction box 236. Finally, architecture 200 comprises a low voltage direct current (LVDC) junction box 238 that receives low voltage DC power, e.g., via electrical communication with one or more DC/DC converters 240. In this example, low-voltage DC power may comprise 24 VDC power. Various low-voltage components and/or loads may be in electrical communication with LVDC junction box 238, such as an electro-hydraulic power (EHP) steering pump 242, house battery charging 244, house loads 246, an ECP cooling system 248, and an HVAC low voltage connection 250.

Electrically-powered vehicles such as those described above with respect to FIGS. 3 and 4A-4C may typically include one or more switches that, when actuated to be placed in an open position, operate to open at least part of the vehicle's high-voltage electrical circuitry so that high-voltage power is not applied to at least part of the electrical load. As noted above, an operator may actuate such switch(es) as part of an LOTO or other safety procedure used to create an electrically safe work condition.

In this regard, an electrically-powered vehicle may comprise a high-voltage interlock loop (HVIL). Very generally, the HVIL may comprise a low voltage circuit that controls one or more switches (e.g., breakers, contactors, and disconnects) electrically disposed within the vehicle's high-voltage circuitry. FIGS. 5A-5C present a circuit diagram of one example of a HVIL 300 that may be used with the high-voltage and accessory architecture 200. Other examples of HVILs may be used with the high-voltage and accessory architecture 200 and all such examples are intended to be within the spirit and scope of the present disclosure.

In the illustrated embodiment, HVIL 300 comprises a circuit that passes in series through certain high-voltage connections on an electrically-powered vehicle, such as the battery-electric buses described above. More particularly, and by way of example, HVIL 300 comprises a system control module (SCM) 302 that is electrically connected in series with a variety of high-voltage components, including but not limited to chargers 228, traction motor 226, motor inverter 224, battery thermal management systems 218, energy storage system junction box 216, HVDC junction box 222, DC/DC converters 240, DC/AC inverter 234, high-voltage AC junction box 236, HVAC 232, and low voltage junction box 238. In particular, each high-voltage component may comprise a high-voltage connector that comprises an HVIL circuit. The HVIL circuit may be a "last mate first break" (LMFB) style circuit in that it may open as soon as the connector is about to be disconnected before the main conductor is disconnected. Although not shown in FIGS. 5A-5C, battery packs 202-214 may each comprise an internal HVIL circuit that is part of HVIL 300. Further, HVIL 300 may be in electrical communication with switches on the interior of component lids and access door panels, though these too are not shown in FIGS. 5A-5C.

In one embodiment, SCM 302 outputs a low voltage signal onto the HVIL 300 circuit. SCM 302 monitors HVIL 300 circuit to determine whether the signal is received. Other devices may monitor subsections of the circuit for fault analysis and troubleshooting assistance. Also, each battery pack 204-214 has HVIL detection within the battery pack and reports the HVIL status back to SCM 302. If any component or switch on the HVIL 300 circuit is disconnected or opened, then the HVIL may be broken, and the SCM 302 may measure an open circuit. SCM 302 may then cause the high-voltage contactors within the high-voltage circuitry (e.g., the high-voltage contactors located in energy storage system junction box 238, HVDC junction box 222, and/or in each battery pack 204-214) to change state (e.g., from a closed position to an open position), thereby isolating all high voltage to battery packs 204-214. As a result, if an individual or operator attempts to access a high-voltage electrical component, e.g., by opening an access door or component lid, HVIL 300 should be opened, and SCM 302 should disconnect energy storage system 202 from the other high-voltage system circuitry and components.

Other switches may be present in the electrically-powered vehicle. For example, battery packs 204-214 of energy storage system 202 may each have a removable manual service disconnect (MSD), the removal of which disables electric current flow from a given battery pack. As shown in FIG. 6, low-voltage junction box 238 may comprise a manual disconnect switch 304. An operator may move switch 304 from the "ON" position to the "OFF" position as part of a LOTO procedure, and when switch 304 is in the "OFF" position, the operator may place a padlock 306 through a metal loop 308 extending from junction box 238 and an aperture defined in switch 304. Thereby, switch 304 may remain "locked out" (e.g., unable to be moved to the "ON" position) until the operator returns with the key to padlock 306. Actuation of switch 304 disconnects the low voltage circuitry of the electrically-powered vehicle. In one embodiment, because HVIL 300 may remain active as long as the low voltage system is connected, removing power to the low voltage circuitry may also cause HVIL 300 to open, thereby disconnecting the high-voltage components as described above.

In the past, while performing the LOTO procedure, the operator would need to take a number of safety precautions, including wearing protective safety gear and using proper measurement tools. Among other things, an operator may need high-voltage rated rubber gloves (e.g., 1000V rated gloves), leather gloves to be worn over the rubber gloves, safety glasses, and a suitably rated multimeter. Moreover, in the past, when the operator performed measurements to ensure that an electrically safe working condition has been created, the operator would need to wear a full-body arc-flash suit. With embodiments of the present disclosure, however, a full-body arc-flash suit may not be required.

In this regard, FIGS. 7 and 8 are perspective views of opposing sides of one example of an energy storage system junction box 310 comprising a test port 340 in accordance with an embodiment of the present disclosure. FIG. 9 is a detail view of junction box 310. FIG. 10 is a perspective view of junction box 310, wherein an operator is using a multimeter at test port 340 to determine the voltage drop across an electrical component of high-voltage circuitry to which junction box 310 is connected.

Energy storage system junction box 310 is configured for use in a high-voltage electrical system of an electrically-powered vehicle, such as high-voltage and accessory architecture 200, described above. Accordingly, in the discussion that follows, reference numerals from components of architecture 200 are used to illustrate certain examples of electrical connections that may occur at junction box 310. More particularly, junction box 310 comprises a box-shaped housing having four vertically-extending side walls 312-318 and a top wall 320 that together define an enclosure. Various physical connectors are provided on the housing of junction box 310. For example, side wall 318 may support connectors 322 for the positive terminals of each battery pack 204-214, and side wall 316 may support connectors 324 for the negative terminals of each battery pack 204-214. On housing side wall 314, connectors 326, 328 are provided for the battery thermal management system 218 and the coolant heater 220, respectively. Further, a connector 330 is provided on this side wall 314 that comprises the HVIL 300 into and out of junction box 310, receives control signals for the electrical contactors within junction box 310, and receives low voltage power (24V) for junction box 310. On side wall 312, two sets of positive and negative output connectors 332, 334 are provided to enable electrical communication between the positive and negative terminals of energy storage system 202 and HVDC junction box 222. In particular, these four connectors are the high voltage outputs from the junction box 310 to the HVDC junction box 222.

Additionally, side wall 312 may support a high voltage disconnect switch 336. Switch 336 comprises, in this example, a rotary handle 338 that is lockable according to a LOTO protocol. When actuated, switch 336 may change state from a first (e.g., closed) position to a second (e.g., open) position. In the closed position, current may flow from energy storage system 202 across switch 336, and in the open position, current may not flow from energy storage system 202. Thus, actuation of switch 336 may disconnect the battery packs 204-214 from the downstream high-voltage system components, as indicated above with respect to switch 18 and FIG. 1.

Junction box 310 comprises a test port 340 in accordance with an embodiment of the present disclosure. For example, test port 340 comprises a pair of electrical connectors 342, 344 disposed on side wall 312. In one embodiment, connectors 342, 344 are IP rated connectors that each comprise a socket configured to receive a testing device (e.g., multimeter) test lead, and the connectors are disposed at the junction box by a distance of at least two inches. In some embodiments, a peripheral surface of connectors 342, 344 may be threaded, and junction box 310 may comprise covers 346, 348 that are threadably received over connectors 342, 344, respectively (See FIGS. 9-10). Covers 346, 348 may each be coupled with junction box 310 via chain or the like to prevent dropping or loss thereof. It will be appreciated that, in other embodiments, covers 346, 348 may not be provided, and instead connectors 342, 344 may be disposed behind a sealed access cover. Such a cover may, in some embodiments, be electrically connected with HVIL 300.

In some embodiments, a body controller of the electrically-powered vehicle may be able to detect when one of covers 346, 348 are removed from its respective connector 342, 344. For instance, covers 346, 348 may be in electrical communication with the body controller via a circuit. When covers 346, 348 are closed, the circuit is completed, and the body controller receives an input that indicates the covers 346, 348 are coupled with connectors 342, 344. Thereby, for example, the body controller may disallow the bus from driving when covers 346, 348 are not coupled with connectors 342, 344. This may prevent dust build-up, which can cause an isolation fault if it occurs. In one example, the covers 346, 348 may not be electrically connected with HVIL 300 because if they were so connected, removal of covers 346, 348 would cause high voltages to be isolated to the battery packs, and test port 340 could not be used (e.g., during a LOTO procedure as described herein) to confirm whether high voltages are or are not present.

In some example embodiments, circuitry within the energy storage junction box 310 may be analogous to that described with reference to FIG. 1 or FIG. 2, above. Thus, for instance, the terminals of connectors 342 and 344 may be electrically connected to the high-voltage circuitry within junction box 310 in a manner similar to that described above with respect to terminals 20, 22 in the embodiments of FIG. 1 or FIG. 2.

Based on the foregoing, it will be appreciated that an operator may use test port 340 as part of a safety protocol to ensure that an electrically safe working condition exists in high-voltage circuitry to which junction box 310 is connected. For example, as part of an LOTO procedure, an operator may first remove covers 346, 348 from connectors 342, 344, respectively. The operator may then insert the conductive tips of respective positive 388 and negative 390 test leads of a testing device, such as a multimeter 392 (FIG. 10), into respective sockets such that an electrical connection is made between the test leads and respective terminals (e.g., terminals 20 and 22 in FIG. 1). Doing so places the resistance of multimeter 392 electrically in parallel with both the electric power source and the electrical load (via connectors 332, 334), such that the voltage drop across the resistance of multimeter 392 may be directly related to the open circuit voltage of the electric power source (depending, of course, on the position/state of switches upstream from the terminals, such as electronic disconnects, electrical contactors within battery packs 204-214, and/or the MSDs in the battery packs 204-214), and subject to the impact of electrical components, such as resistors, within the circuitry of junction box 310.

In one embodiment of a safety protocol, an operator may use test leads 388, 390 of multimeter 392 to measure the respective voltage drops between the terminals. If, as shown in FIG. 10, the voltage reading is above a predetermined threshold, such as five volts (5V) or fifty volts (50V), depending on the test resistance and otherwise the voltage divider network, then the operator may determine that high voltage is present within the system. Notably, in performing these test measurements, in embodiments of the present disclosure the operator may only need to use a suitably rated multimeter, high-voltage rated gloves, and safety glasses when taking measurements. Again, because of the design of test port 340 and the configuration of the circuitry within junction box 310, in the event of a short circuit between one of the terminals and ground or between one of the terminals and the electrical power source, the current flowing through such short circuit will be below levels that are dangerous to humans.

The operator may proceed to close various switches as part of the LOTO protocol, such as the low-voltage junction box 238 manual disconnect switch 304 and the high voltage disconnect switch 336 of junction box 310. In some embodiments, the operator may be able to see the voltage dropping on the multimeter 392 display as the LOTO protocol is implemented. The operator may then (or after a predetermined amount of time) repeat the same test measurement across the terminals. If the voltage measured is below the predetermined threshold, then the operator may determine that high-voltage has been safely isolated to the battery packs 204-214 and removed from the high-voltage components downstream therefrom. Thus, the operator will have verified that an electrically safe working condition exists.

Those of skill in the art will appreciate that other benefits derive from embodiments of the present disclosure. For instance, in some embodiments, the electrical configuration of the test port may cause only a minimal voltage drop at the test instrument. Further, prior to the present disclosure, an operator was sometimes required to remove the MSDs from each of the battery packs of a vehicle's energy storage system as part of the safety protocol to ensure that an electrically safe working condition had been created. Doing so is generally undesirable, though. For example, gaining access to all battery packs of an electrically-powered vehicle can be cumbersome and time consuming. On an electrically-powered bus, for instance, one or more battery packs may be located in/on the roof of the bus, one or more battery packs may be located at the rear of the bus chassis, and one or more battery packs may be located in a forward position on the chassis. Moreover, removing the MSDs may cause a vehicle's control system to register fault codes and errors that must be cleared by the operator before the vehicle can be returned to normal operation. Further, the MSDs have a lifetime of approximately five hundred (500) insertion and removal cycles. In embodiments of the disclosure described above, though, the combination of the high voltage disconnect switch 336 of junction box 310 and test port 340 means that an operator can safely work on the high-voltage system downstream of junction box 310 without having to remove the MSDs from each of the battery packs 204-214.

Additionally, in various embodiments, an isolation meter may be used with test port 340/connectors 342 and 344 to perform an isolation check. As those of skill in the art will appreciate, additional isolation checking may be required if the test indicates a failure or an unclear result, or if other indicators from battery measurement points are indicating isolation failure separately. In one embodiment, test port 340/connectors 342 and 344 may be used to measure the overall system resistance to determine if a leakage issue (e.g., isolation fault) is present. For instance, leakage may be occurring if there is a path between high voltage positive to ground, high voltage negative to ground, or high voltage positive to high voltage negative.

In various embodiments, a testing device, such as but not limited to a multimeter, may be built into or otherwise disposed in a junction box containing a test port or otherwise part of the electric bus, in a position so that the testing device's output screen is visible to an operator. For instance, where the testing device is disposed within the junction box, a transparent window may be provided in the junction box so that an operator can view the testing device's output data from a position outside the junction box. Accordingly, the testing device may always be present or, if not permanent, may be disposed in the junction box for some period of time, and the operator will not need to be concerned with connecting the testing device. The operation of such an arrangement, from the standpoint of current flow in the event of short circuits, is similar to that described above with regard to FIG. 1, where the test instrument's resistance corresponds to resistance 44 in FIG. 1.

Based on the foregoing, it will be appreciated that embodiments of the disclosure provide improved systems and methods for ensuring that a high-voltage electrical system is in an electrically safe working condition. Many modifications and other embodiments of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A high-voltage electrical system, comprising:
a high voltage electric power source, the high voltage electric power source comprising one or more batteries together capable of storing at least 200 kWh of energy;
an electrical load;
electrical circuitry including the electric power source and the electrical load so that the electric power source applies high voltage power to the electrical load;
at least one switch disposed in the electrical circuitry upstream from the electrical load with respect to the electric power source so that the at least one switch, in a first switch state, conducts electric current within the electrical circuitry through the at least one switch and, in a second switch state, opens at least part of the electrical circuitry so that the high voltage power is not applied to at least part of the electrical load;
a test port comprising
a first electrical terminal disposed within an IP rated connector configured to receive a first test lead of a test instrument, the first electrical terminal connected to a first position, between the at least one switch and the electrical load, in a portion of the electrical circuitry at which high voltage exists when the at least one switch is in the first switch state, and
a second electrical terminal disposed within an IP rated connector that is offset from the connector of the first electrical terminal and configured to receive a second test lead of the test instrument, the second electrical terminal connected to a second position, between the at least one switch and the electrical load, in the portion of the electrical circuitry,
wherein application of a predetermined resistance via the test instrument electrically between the first said test lead received by the first electrical terminal and the second said test lead received by the second electrical terminal produces a voltage drop across the predetermined resistance that is in a voltage drop first state when the at least one switch is in its first switch state and is in a voltage drop second state when the at least one switch is in its second switch state, wherein the voltage drop first state is different from the voltage drop second state;
a first at least one electrical component electrically disposed between the first electrical terminal and the first position in the portion of the electrical circuitry so that the first at least one electrical component passes at most a low level of electric current from the first position to the first electrical terminal when a short circuit between the first electrical terminal and the portion of the electrical circuitry completes an electric circuit that includes the first at least one electrical component and the electric power source;
a second at least one electrical component electrically disposed between the second electrical terminal and the second position in the portion of the electrical circuitry so that the second at least one electrical component passes at most a low level of electric current from the second position to the second electrical terminal when a short circuit between the second electrical terminal and the portion of the electrical circuitry completes an electric circuit that includes the second at least one electrical component and the electric power source; and
a junction box disposed between the high-voltage electrical power source and the electrical load and having a housing that encloses the first position, the second position, the first at least one electrical component, and the second at least one electrical component, wherein the test port is disposed in the housing.

2. The high-voltage electrical system as in claim 1, wherein the electric power source is a battery.

3. The high-voltage electrical system as in claim 1, wherein the at least one switch is an electrical contactor.

4. The high-voltage electrical system as in claim 1, wherein each of the first position and the second position is disposed electrically in parallel to both the electric power source and the electrical load.

5. The high-voltage electrical system as in claim 1, comprising
a third at least one electrical component electrically disposed between the first electrical terminal and the second position in the portion of the electrical circuitry so that the third at least one electrical component passes at most a low level of electric current from the second position to the first electrical terminal when a short circuit between the first electrical terminal and the portion of the electrical circuitry completes an electric circuit that includes the third at least one electrical component and the electric power source, and
a fourth at least one electrical component electrically disposed between the second electrical terminal and the first position in the portion of the electrical circuitry so that the fourth at least one electrical component passes at most a low level of electric current from the first position to the second electrical terminal when a short circuit between the second electrical terminal and the portion of the electrical circuitry completes an electric circuit that includes the fourth at least one electrical component and the electric power source.

6. The high-voltage electrical system as in claim 5, wherein the third at least one electrical component comprises the second at least one electrical component and wherein the fourth at least one electrical component comprises the first at least one electrical component.

7. An electric bus, comprising:
a body supported by a plurality of wheels;
at least one electric motor disposed so that the at least one electric motor drives the plurality of wheels;
a high voltage electric power source supported by the body and in electrical communication with the at least one electric motor, wherein the electric power source comprises one or more battery packs together capable of storing at least 200 kWh of energy;
an electrical load including the at least one electric motor;
electrical circuitry including the electric power source and the electrical load so that the electric power source applies high voltage power to the electrical load;
at least one switch disposed in the electrical circuitry upstream from the electrical load with respect to the electric power source so that the at least one switch, in a first switch state, conducts electric current within the electrical circuitry through the at least one switch and, in a second switch state, opens at least part of the electrical circuitry so that the high voltage power is not applied to at least part of the electrical load;
a test port comprising
a first electrical terminal disposed within an IP rated connector configured to receive a first test lead of a test instrument, the first electrical terminal connected to a first position, between the at least one switch and the electrical load, in a portion of the electrical circuitry at which high voltage exists when the at least one switch is in the first switch state, and
a second electrical terminal disposed within an IP rated connector that is offset from the connector of the first electrical terminal and configured to receive a second test lead of the test instrument, the second electrical terminal connected to a second position, between the at least one switch and the electrical load, in the portion of the electrical circuitry,
wherein application of a predetermined resistance via the test instrument electrically between the first said test lead received by the first electrical terminal and the second said test lead received by the second electrical terminal produces a voltage drop across the predetermined resistance that is in a voltage drop first state when the at least one switch is in its first switch state and is in a voltage drop second state when the at least one switch is in its second switch state, wherein the voltage drop first state is different from the voltage drop second state;
a first at least one electrical component electrically disposed between the first electrical terminal and the first position in the portion of the electrical circuitry so that the first at least one electrical component passes at most a low level of electric current from the first position in the portion of the electrical circuitry to the first electrical terminal when a short circuit between the first electrical terminal and the portion of the electrical circuitry completes an electric circuit that includes the first at least one electrical component and the electric power source;
a second at least one electrical component electrically disposed between the second electrical terminal and the second position in the portion of the electrical circuitry so that the second at least one electrical component passes at most a low level electric current from the second position to the second electrical terminal when a short circuit between the second electrical terminal and the portion of the electrical circuitry completes an electric circuit that includes the second at least one electrical component and the electric power source; and
a junction box disposed between the high-voltage electrical power source and the electrical load and having a housing that encloses the first position, the second position, the first at least one electrical component, and the second at least one electrical component, wherein the test port is disposed in the housing.

8. The electric bus as in claim 7, comprising
a third at least one electrical component electrically disposed between the first electrical terminal and the second position in the portion of the electrical circuitry so that the third at least one electrical component passes at most a low level of electric current from the second position to the first electrical terminal when a short circuit between the first electrical terminal and the portion of the electrical circuitry completes an electric circuit that includes the third at least one electrical component and the electric power source, and
a fourth at least one electrical component electrically disposed between the second electrical terminal and the first position in the portion of the electrical circuitry so that the fourth at least one electrical component passes at most a low level of electric current from the first position to the second electrical terminal when a short circuit between the second electrical terminal and the portion of the electrical circuitry completes an electric circuit that includes the fourth at least one electrical component and the electric power source.

9. The electric bus as in claim 8, wherein the third at least one electrical component comprises the second at least one electrical component and wherein the fourth at least one electrical component comprises the first at least one electrical component.

10. The electric bus as in claim 7, wherein the at least one switch is an electrical contactor.

11. The electric bus as in claim 7, wherein each of the first position and the second position is disposed electrically in parallel to both the electric power source and the electrical load.

12. A method of testing a high-voltage electrical system within an electric bus, comprising the steps of:
providing
a body supported by a plurality of wheels,
at least one electric motor disposed so that the at least one electric motor drives the plurality of wheels,
a high-voltage electric power source in electrical communication with the at least one electric motor, the high-voltage electric power source comprising one or more batteries together capable of storing at least 200 kWh of energy,
an electrical load, including the at least one electric motor, disposed electrically across the electric power source so that the electric power source provides electric power to the electrical load,
a test port comprising
a first electrical terminal disposed within an IP rated connector configured to receive a first test lead of a test instrument, and
a second electrical terminal disposed within an IP rated connector that is offset from the connector of the first electrical terminal and configured to receive a second test lead of the test instrument,
a first at least one electrical component disposed and configured so that the first at least one electrical component passes at most a low level electric current toward the first electrical terminal when a short circuit between the first electrical terminal and a portion of electrical circuitry including the electric power source and the electrical load that has a high voltage level completes an electric circuit that includes the first at least one electrical component and the electric power source, and
a second at least one electrical component disposed and configured so that the second at least one electrical component passes at most a low level electric current toward the second electrical terminal when a short circuit between a portion of the electrical circuitry completes an electric circuit that includes the second at least one electrical component and the electric power source;
at least one switch disposed in the electrical circuitry upstream from the electrical load with respect to the electric power source so that the at least one switch, in a first switch state, conducts electric current within the electrical circuitry through the at least one switch and, in a second switch state, opens at least part of the electrical circuitry so that the high voltage power is not applied to at least part of the electrical load; and
a junction box disposed between the high-voltage electrical power source and the electrical load, the junction box having a housing that encloses the first at least one electrical component and the second at least one electrical component, wherein the test port is disposed in the housing; and operatively connecting a voltage test meter electrically between the first said test lead received by the first electrical terminal and the second said test lead received by the second electrical terminal.

13. The method as in claim 12, wherein the providing step comprises providing at least one switch
   disposed electrically between
      the electric power source, and
      the electrical load and at least one of the first electrical terminal and the second electrical terminal
   so that the at least one switch, in a first switch state, conducts electric current between
      the electric power source, and
      the electrical load and at least one of the first electrical terminal and the second electrical terminal
   and, in a second switch state, blocks flow of electric current from the electric power source to at least part of the electrical load.

14. The method as in claim 12, wherein the one or more batteries together are capable of storing at least 400 kWh of energy.

\* \* \* \* \*